United States Patent
Koo et al.

(10) Patent No.: US 11,451,731 B2
(45) Date of Patent: Sep. 20, 2022

(54) COUNTER CIRCUIT AND IMAGE SENSOR INCLUDING THE SAME

(71) Applicant: SAMSUNG ELECTRONICS CO., LTD., Suwon-si (KR)

(72) Inventors: Jahyun Koo, Yongin-si (KR); Hyeokjong Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 157 days.

(21) Appl. No.: 16/908,980

(22) Filed: Jun. 23, 2020

(65) Prior Publication Data

US 2021/0120201 A1   Apr. 22, 2021

(30) Foreign Application Priority Data

Oct. 18, 2019   (KR) .................. 10-2019-0129942

(51) Int. Cl.
| | |
|---|---|
| *H04N 5/3745* | (2011.01) |
| *H01L 27/146* | (2006.01) |
| *H03M 1/16* | (2006.01) |
| *H04N 5/378* | (2011.01) |
| *H03M 1/12* | (2006.01) |
| *H03M 1/56* | (2006.01) |
| *H04N 5/357* | (2011.01) |
| *H04N 5/347* | (2011.01) |
| *H04N 5/376* | (2011.01) |
| *H04N 5/374* | (2011.01) |

(52) U.S. Cl.
CPC .............. *H04N 5/37455* (2013.01); *H01L 27/14609* (2013.01); *H03M 1/162* (2013.01); *H04N 5/378* (2013.01)

(58) Field of Classification Search
CPC .............. H04N 5/37455; H04N 5/378; H04N 5/3575; H04N 5/347; H04N 5/3765; H04N 5/3741; H04N 5/3745; H04N 5/369; H04N 5/374; H04N 5/335; H01L 27/14609; H03M 1/162; H03M 1/123; H03M 1/56; H03M 1/1295
See application file for complete search history.

(56) References Cited

U.S. PATENT DOCUMENTS 3,872,466 A * 3/1975 Wold .................. H03M 1/1295
341/118
7,990,304 B2   8/2011 Lim et al.
(Continued)

*Primary Examiner* — Albert H Cutler
(74) *Attorney, Agent, or Firm* — Lee IP Law, P.C.

(57) ABSTRACT

An image sensor includes a pixel sensor outputting an analog sampling signal; a sampling unit comparing the sampling signal and a ramp signal, and outputting a comparison signal that is time-axis length information; and a counter counting a length of the comparison signal based on a clock signal and first and second complement control signals. The counter includes an AND gate ANDing the comparison signal and the clock signal; and a counting unit triggered at a falling edge of the AND gate output to output a count value. The counting unit includes a complement operation controller storing an inverted count value that is an inversion of the count value in response to the first complement control signal, and outputting the inverted count value in response to the second complement control signal; and a D-flip-flop that is set or reset depending on the inverted count value, and outputs the count value.

19 Claims, 20 Drawing Sheets

(56) References Cited

U.S. PATENT DOCUMENTS

| | | |
|---|---|---|
| 8,395,539 B2 | 3/2013 | Lim et al. |
| 8,576,979 B2 | 11/2013 | Mo et al. |
| 8,969,770 B2 | 3/2015 | Kim et al. |
| 9,184,753 B2 | 11/2015 | Shin |
| 9,774,333 B2 | 9/2017 | Tubert |
| 9,871,986 B2 | 1/2018 | Hisamatsu |
| 2011/0122274 A1 | 5/2011 | Itzhak et al. |
| 2012/0280113 A1 | 11/2012 | Kim et al. |
| 2013/0343506 A1* | 12/2013 | Hisamatsu ............ H03K 21/023 377/42 |
| 2015/0028190 A1 | 1/2015 | Shin et al. |
| 2015/0129748 A1* | 5/2015 | Kim ....................... H04N 5/378 250/208.1 |
| 2017/0085817 A1 | 3/2017 | Yeh et al. |

* cited by examiner

COUNTER CIRCUIT AND IMAGE SENSOR INCLUDING THE SAME

CROSS-REFERENCE TO RELATED APPLICATION

Korean Patent Application No. 10-2019-0129942, filed on Oct. 18, 2019, in the Korean Intellectual Property Office, and entitled: "Counter Circuit and Image Sensor Comprising the Same," is incorporated by reference herein in its entirety.

BACKGROUND

1. Field

Embodiments relate to a counter circuit and an image sensor including the same.

2. Description of the Related Art

A counter may be used to convert an effective physical quantity, such as an intensity of light, an intensity of sound, or a time, into a digital signal. An image sensor may obtain an image by using a characteristic of semiconductor reacting to an incident light. An analog-to-digital converter ("ADC") may be used to convert an analog signal output from a pixel array of the image sensor into a digital signal. The ADC may be implemented by using a counter that performs a counting operation based on a clock signal.

SUMMARY

Embodiments are directed to an image sensor, including a pixel sensor configured to sense an incident light and to output an analog sampling signal; a sampling unit configured to compare the sampling signal and a ramp signal, and to output a comparison signal that is time-axis length information; and a counter configured to count a length of the comparison signal in response to a clock signal, a first complement control signal, and a second complement control signal. The counter may include a first AND gate configured to perform an AND operation on the comparison signal and the clock signal; and a first counting unit triggered at a falling edge of an output of the first AND gate to output a first count value. The first counting unit may include a first complement operation controller configured to store an inverted first count value corresponding to an inverted version of the first count value in response to the first complement control signal, and to output the inverted first count value in response to the second complement control signal; and a first D-flip-flop that is set or reset depending on the inverted first count value output from the first complement operation controller, and configured to output the first count value.

Embodiments are also directed to a counter circuit that counts a high period or a low period of an input signal using a clock signal, the counter circuit including a first AND gate configured to perform an AND operation on the input signal and the clock signal; and a ripple counter triggered by an output of the first AND gate to count a length of the input signal, the ripple counter including a plurality of counting units for counting up or counting down the length of the input signal, each of the plurality of counting units including a D-latch configured to store an inverted counting bit in response to a first complement control signal; and a D-flip-flop that is set or reset by the inverted counting bit stored in the D-latch in response to a second complement control signal.

Embodiments are also directed to a counter circuit that counts a high period or a low period of an input signal using a clock signal, the counter circuit including a first AND gate configured to perform an AND operation on the input signal and the clock signal; and a ripple counter including a first counting unit and a second counting unit that are triggered by an output of the first AND gate to count a length of the input signal, the first counting unit toggling a first count bit, and the second counting unit toggling a second count bit that is an upper bit of the first count bit. When a division control signal is activated, the first counting unit may latches and outputs an inverted second count bit that is an inverted version of the second count bit toggled by the second counting unit.

BRIEF DESCRIPTION OF THE FIGURES

Features will become apparent to those of skill in the art by describing in detail example embodiments with reference to the attached drawings in which.

DETAILED DESCRIPTION

In the following description, features and functions of example embodiments may be described in the context of a CMOS image sensor. However, the CMOS image sensor is merely an example.

Figure 1:
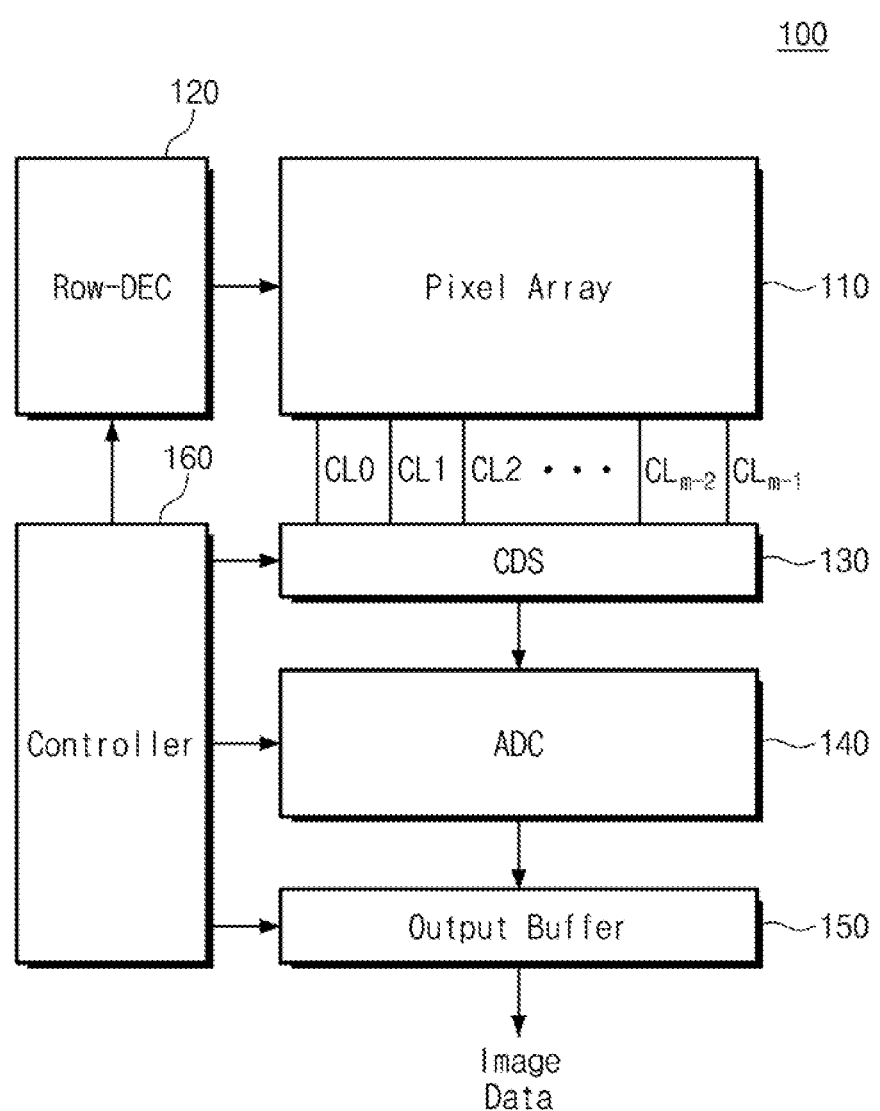
FIG. 1 is a block diagram illustrating an image sensor according to an example embodiment.

FIG. 1 is a block diagram illustrating an image sensor according to an example embodiment.

Referring to FIG. 1, an image sensor 100 may include a pixel sensor array 110, a row decoder 120, a correlated double sampler (CDS) 130, an analog-to-digital converter (ADC) 140, an output buffer 150, and a controller 160.

The pixel sensor array 110 may include a plurality of pixel sensors, each converting a light signal into an electrical signal, arranged two-dimensionally. One pixel sensor may include a single photoelectric conversion element (e.g., a photodiode). In another implementation, the pixel sensor may include at least two photoelectric conversion elements and may be driven in a reset multiple sampling scheme.

The pixel sensor array 110 may be driven by signals that are provided from the row decoder 120, e.g., signals such as a selection signal SEL, a reset signal RS, and a transfer signal TG. Electrical signals from the pixel sensors, provided in response to the driving signals, may be provided to the CDS 130 through a plurality of column lines CL0, CL1, . . . CLm−1.

The row decoder 120 may select a row of the pixel sensor array 110 under control of the controller 160. The row decoder 120 may generate the selection signal SEL for selecting one of the rows. The row decoder 120 may sequentially activate the reset signal RS and the transfer signal TG with regard to pixel sensors corresponding to the selected row. In this case, a reset signal RESET and the image signal SIG, generated from each of the activated pixel sensors of the selected row in an analog shape, may be sequentially transferred to the CDS 130.

The CDS 130 may sequentially sample and hold a set of the reset signal RESET and the image signal SIG provided from the pixel sensor array 110 to each of a plurality of column lines CL0 to CLm−1. Thus, the CDS 130 may sample and hold the levels of the reset signal RESET and the image signal SIG corresponding to each of columns. The CDS 130 may transfer the reset signals RESET and the image signals SIG of the columns, which are sampled under control of the controller 160 in units of a plurality of columns, to the ADC 140.

The ADC 140 may convert a sampling signal of each column output from the CDS 130 into a digital signal. According to the present example embodiment, the ADC 140 includes a counter capable of performing a complement operation and a division operation.

The reset signal RESET and the image signal SIG may be counted by the counter using a clock signal CLK. A count value corresponding to the reset signal RESET may be subtracted from a count value of the image signal SIG. The count value corresponding to the reset signal RESET may be converted into a negative number by the complement operation. Thus, image data may be generated through an addition operation.

In the present example embodiment, the counter has a circuit structure that may help reduce or eliminate coupling in the complement operation. Thus, image data of high reliability, uninfluenced by coupling between signal lines, may be sampled by the counter. In an example embodiment, an image sensor using a reset multiple sampling technique may be combined with a counter having a division function to reduce noise.

The output buffer 150 may latch and output image data provided from the ADC 140 in units of a column. Under control of the controller 160, the output buffer 150 may temporarily store image data output from the ADC 140 and may then output the sequentially latched image data. The output buffer 150 may be included in the image sensor 100 or may not be included in the image sensor 100.

The controller 160 may control the pixel sensor array 110, the row decoder 120, the CDS 130, the ADC 140, and the output buffer 150. The controller 160 may supply control signals (e.g., a clock signal and a timing control signal) that are used for operations of the pixel sensor array 110, the row decoder 120, the CDS 130, the ADC 140, and the output buffer 150. The controller 160 may include a logic control circuit, a phase locked loop (PLL) circuit, a timing control circuit, a communication interface circuit, etc.

In the present example embodiment, the ADC 140 includes a counter that calculates a difference value of the reset signal RESET and the image signal SIG corresponding to each column. The counter may further include a division function for supporting a reset multiple sampling function. Accordingly, the ADC 140 may not be influenced by coupling that causes a sensing error. Further, the image sensor 100 using the counter having the division function may use the reset multiple sampling scheme capable of reducing a noise.

Figure 2:
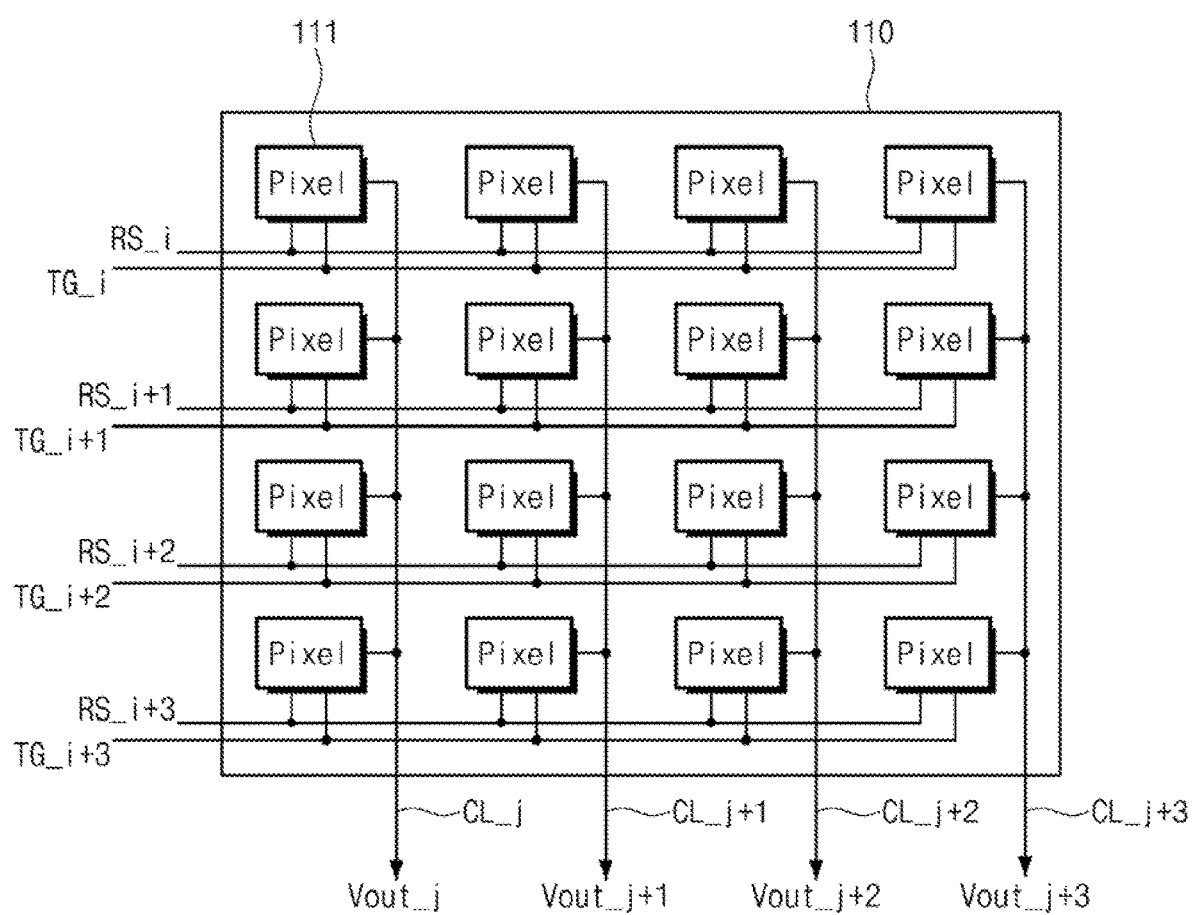
FIG. 2 is a block diagram illustrating a pixel sensor array according to an example embodiment.

FIG. 2 is a block diagram illustrating a pixel sensor array according to an example embodiment.

Referring to FIG. 2, the pixel sensor array 110 includes pixel sensors arranged in a matrix of a plurality of rows and a plurality of columns.

Each pixel sensor 111 of the pixel sensor array 110 may include at least one of a red filter, a green filter, and a blue filter. The red filter transmits a light in a red wavelength band, the green filter transmits a light in a green wavelength band, and the blue filter transmits a light in a blue wavelength band. The pixel sensor 111 may include a plurality of transistors and a photoelectric conversion element, and may sense light by using the photoelectric conversion element, convert the sensed light into an electrical signal, and output the electrical signal through a column line CL. In addition, to apply the reset multiple sampling technique, the pixel sensor 111 may be implemented to have a structure including at least two photoelectric conversion elements.

When a reset signal RS_i and a transfer signal TG_i are provided to a selected row "i" of the pixel sensor array 110, sampling signals Vout_j, Vout_j+1, Vout_j+2, and Vout_j+3 corresponding to the reset signal RS_i and the transfer signal TG_i may be output to column lines CL_j, CL_j+1, CL_j+2, and CL_j+3 of the selected row "i". The sampling signals Vout_j, Vout_j+1, Vout_j+2, and Vout_j+3 may be provided to the CDS 130 so as to be sampled as the reset signal RESET and the image signal SIG.

Figure 3:
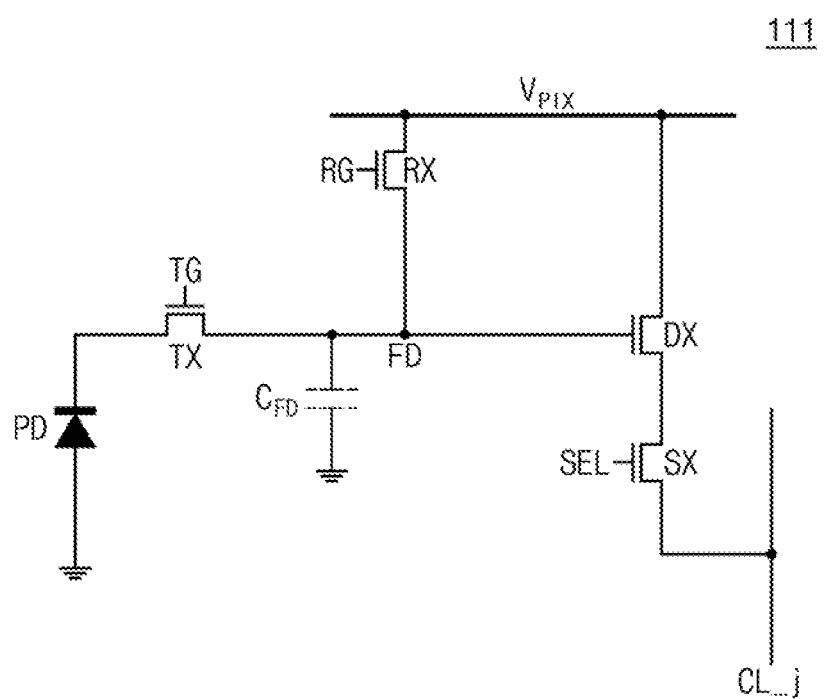
FIG. 3 is a circuit diagram illustrating an example configuration of one pixel sensor illustrated in FIG. 2.

FIG. 3 is a circuit diagram illustrating an example configuration of one pixel sensor illustrated in FIG. 2.

Referring to FIG. 3, the pixel sensor 111 may include, for example, one photoelectric conversion element PD and four NMOS transistors TX, RX, DX, and SX. The pixel sensor 111 may further include, for example, a transistor or a capacitor for various functions.

The photoelectric conversion element PD may be a light sensing element for generating and accumulating charges based on the amount of incident light or the intensity of light. The photoelectric conversion element PD may be implemented with, for example, a photo diode, a photo transistor, a photo gate, or a pinned photo diode (PPD).

In the present example embodiment, the transfer transistor TX transfers charges accumulated at the photoelectric conversion element PD to a floating diffusion area FD. The transfer transistor TX may be generally implemented with one transistor, turned on or off in response to the transfer signal TG_i provided from the row decoder 120.

The floating diffusion area FD may have a function of detecting charges corresponding to the amount of incident light. In the present example embodiment, the floating diffusion area FD integrates charges provided from the photoelectric conversion element PD while the transfer signal TG_i is activated. To accumulate charges, the floating diffusion area FD may have a capacitance $C_{FD}$ of a given magnitude. The floating diffusion area FD is connected with a gate terminal of a drive transistor DX operating as a source follower amplifier. The floating diffusion area FD may be provided with a power supply voltage VDD by the reset transistor RX.

In the present example embodiment, the reset transistor RX resets the floating diffusion area FD in response to the reset signal RG_i. A source of the reset transistor RX is connected to the floating diffusion area FD, and a drain thereof is connected to a power supply voltage (VDD) terminal. When the reset transistor RX is turned on by a bias voltage of the reset signal RS_i, the power supply voltage VDD connected with the drain of the reset transistor RX is transferred to the floating diffusion area FD. The charges accumulated at the floating diffusion area FD move to the power supply voltage (VDD) terminal, and a voltage of the floating diffusion area FD is reset.

In the present example embodiment, the drive transistor DX operates as a source follower amplifier, amplifies the change in an electrical potential of the floating diffusion area FD, and outputs a result of the amplification as the sense voltage Vout_j.

In the present example embodiment, the selection transistor SX selects a pixel sensor to be read in units of a row. The selection transistor SX is driven by the selection signal SEL provided in units of a row. When the selection transistor SX is turned on, the potential of the floating diffusion area FD may be amplified through the drive transistor DX and may then be transferred to a drain of the selection transistor SX. Driving signal lines TG_i, RG_i, and SEL of the transfer transistor TX, the reset transistor RX, and the selection transistor SX extend in a row direction (e.g., a horizontal direction) such that unit pixel sensors included in the same row are simultaneously driven.

Figure 4:
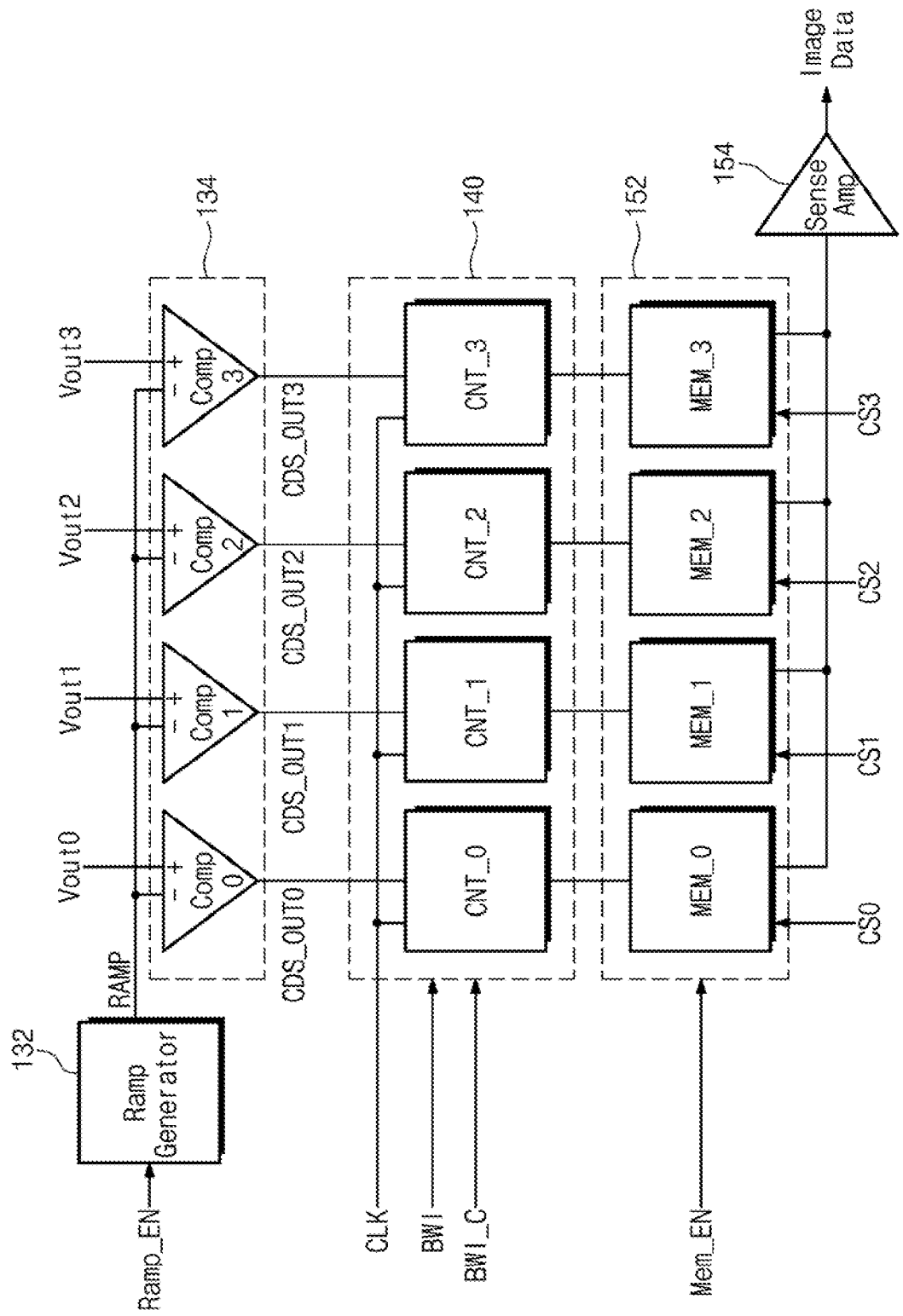
FIG. 4 is a block diagram illustrating an example structure of a correlated double sampler, an analog-to-digital converter, and an output buffer of FIG. 1.

FIG. 4 is a block diagram illustrating an example structure of a correlated double sampler, an analog-to-digital converter, and an output buffer of FIG. 1.

Referring to FIG. 4, the CDS 130 may include a ramp signal generator 132 and comparators 134. The ADC 140 may include a plurality of counters CNT_0, CNT_1, CNT_2, and CNT_3. The output buffer 150 may include memories MEM_0, MEM_1, MEM_2, and MEM_3, and a sense amplifier 154. The output buffer 150 may be included in the image sensor 100 or may not be included in the image sensor 100.

In the present example embodiment, the ramp signal generator 132 of the CDS 130 outputs a ramp signal RAMP having a uniform falling or rising slope in response to a control signal Ramp_EN from the controller 160. Thus, the ramp signal generator 132 continuously generates the ramp signal RAMP having a particular slope under control of the controller 160. Through the comparison with the ramp signal RAMP, each of the reset signal RESET and the image signal SIG is converted into time-axis length information.

The comparators 134 may include a plurality of comparators Comp0, Comp1, Comp2, and Comp3 corresponding to respective columns of the pixel sensor array 110. In the present example embodiment, the comparators 134 compare sampling signals Vout0, Vout1, Vout2, and Vout3 respectively corresponding to columns with the ramp signal RAMP. Each of the sampling signals Vout0, Vout1, Vout2, and Vout3 includes the reset signal RESET and the image signal SIG that are sampled and held by a correlated double sampling operation.

An operation in which the first comparator Comp0 compares the sampling signal Vout0 and the ramp signal RAMP will now be described. In the present example embodiment, the ramp signal RAMP is input to an inverting input terminal (−) of the first comparator Comp0, and the sampling signal Vout0 is input to a non-inverting input terminal (+) of the first comparator Comp0. The first comparator Comp0 may output a CDS output signal CDS_OUT0 by comparing the ramp signal RAMP and the reset signal RESET of the sampling signal Vout0 in a first period and comparing the ramp signal RAMP and the image signal SIG of the sampling signal Vout0 in a second period. Through this procedure, the reset signal RESET and the image signal SIG including level information may be converted into time-axis length information. Operating characteristics of the second, third, and fourth comparators Comp1, Comp2, and Comp3 are substantially identical to the operating characteristic of the first comparator Comp0 except columns corresponding to the comparators Comp0 to Comp3 are different, and thus, additional description will be omitted to avoid redundancy.

In the present example embodiment, the ADC 140 includes counters CNT_0, CNT_1, CNT_2, and CNT_3 that are provided with the clock signal CLK and complement control signals BWI and BWI_C from the controller 160. The counters CNT_0 to CNT_3 may count CDS output signals CDS_OUT0 to CDS_OUT3 of the comparators 134 corresponding to the time-axis length information and may convert count values to digital information. The counters CNT_0 to CNT_3 may perform a stable complement operation on a count value even under the condition that the complement control signals BWI and BWI_C are unstable due to the coupling. A structure and an operation of the counters CNT_0 to CNT_3 will be more fully described with reference to FIGS. 5 to 8.

The output buffer 150 may include a column memory 152 and the sense amplifier 154. The column memory 152 may store image data corresponding to each column in response to a control signal Mem_EN from the controller 160. The column memory 152 may include the plurality of memories MEM_0, MEM_1, MEM_2, and MEM_3, each of which transfers image data stored therein to the sense amplifier 154. The output buffer 150 may be included in the image sensor 100 (refer to FIG. 1) or may not be included in the image sensor 100.

The structure of the ADC 140 including the counters CNT_0, CNT_1, CNT_2, and CNT_3 according to an example embodiment is described above. Each of the counters CNT_0, CNT_1, CNT_2, and CNT_3 according to an example embodiment may be able to perform a stable complement operation even in the condition that the complement control signals BWI and BWI_C are unstable due to the coupling.

Figure 5:
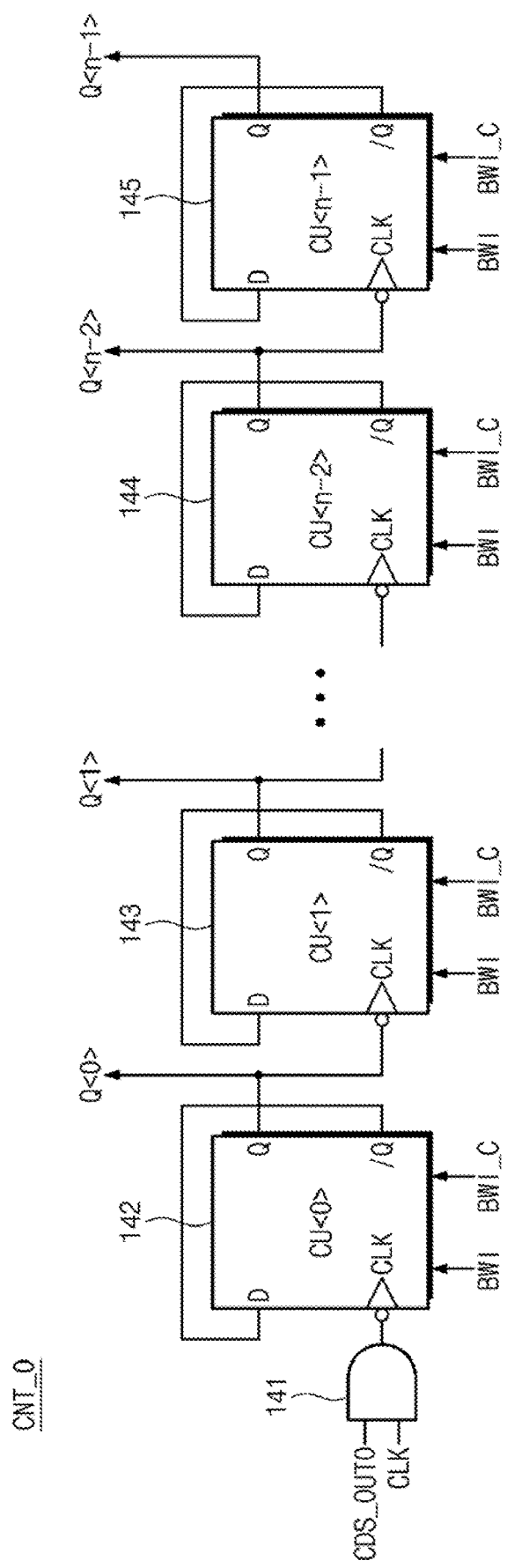
FIG. 5 is a circuit diagram illustrating a counter according to an example embodiment.

FIG. 5 is a circuit diagram illustrating a counter according to an example embodiment.

An example structure of the counter CNT_0 of the counters CNT_0 to CNT_3 of FIG. 4 is illustrated in FIG. 5. Structures of the counters CNT_1, CNT_2, and CNT_3 may be identical to the structure of the counter CNT_0.

The counter CNT_0 may include an AND gate 141 and a plurality of counting units 142, 143, 144, and 145. The counter CNT_0 may be implemented as an asynchronous ripple counter in which one counting unit 142 is triggered by the clock signal CLK. In the present example embodiment, the AND gate 141 transfers the clock signal CLK to a "CLK" input terminal of the first counting unit 142 only in a high-level period of the CDS output signal CDS_OUT0.

In the present example embodiment, the first counting unit 142 includes a D-flip-flop that is triggered at a falling edge of a signal provided to the "CLK" input terminal basically. Thus, signals of output terminals Q and /Q are toggled at a falling edge of an input clock of the first counting unit 142. The inverted output terminal /Q is connected to a data input terminal "D" of the first counting unit 142. Accordingly, an output of the first counting unit 142 outputs a least significant bit Q<0> that repeatedly toggles in synchronization with the falling edge of the input clock. The first counting unit 142 may invert and output the latched data in response to the complement control signals BWI and BWI_C. Functions of the second to fourth counting units 143 to 145 are substantially identical to the function of the first counting unit 142.

According to the above function, the counter CNT_0 counts the reset signal RESET that is provided as the CDS output signal CDS_OUT0. When the complement control signals BWI and BWI_C are provided, a count value of the reset signal RESET may be inverted and converted into the ones' complement. The complement may be used as a negative number in a binary operation. Accordingly, an image data value (SIG−RESET) that corresponds to a result of subtracting the reset signal RESET from the image signal SIG may be obtained from the counter CNT_0 by counting up the image signal SIG based on the inverted count value of the reset signal RESET.

In the present example embodiment, the counter CNT_0 may perform a stable count operation by using the D-flip-flip (or D-latch) even if the complement control signals BWI and BWI_C fluctuate due to the coupling. This will be described in further detail below.

Figure 6A:
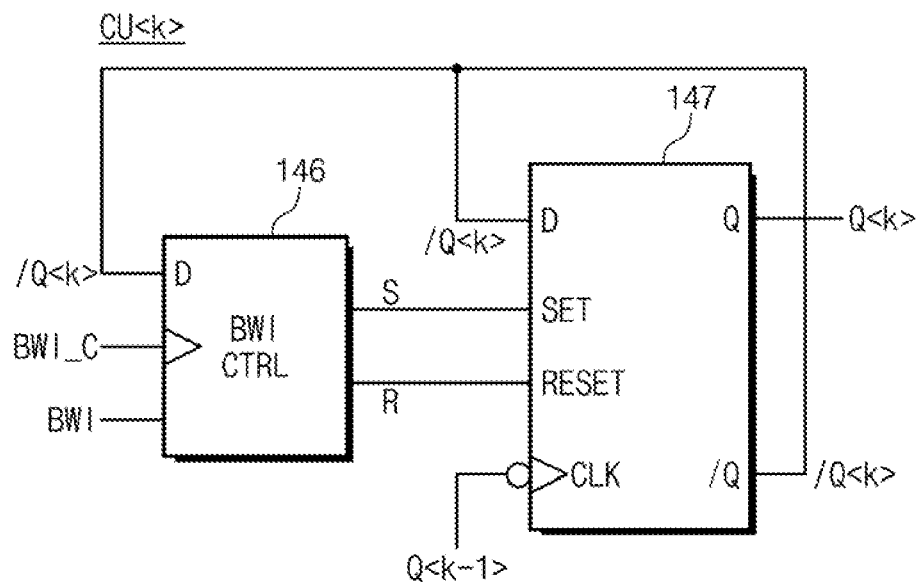
FIGS. 6A and 6B are block diagrams illustrating a structure of a counting unit of FIG. 5.
Figure 6B:
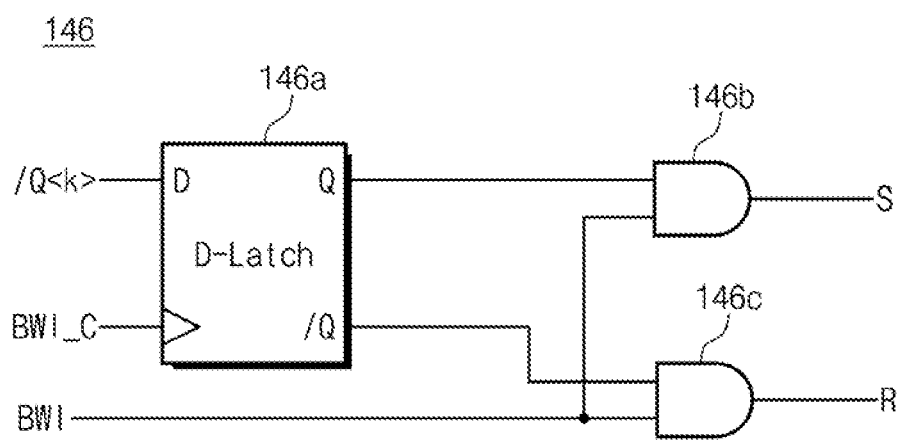

FIGS. 6A and 6B are block diagrams illustrating a structure of a counting unit of FIG. 5.

Referring to FIGS. 6A and 6B, a counting unit CU<k> (which corresponds to one of the counting units CU<0> to CU<n−1> constituting the counter CNT_0) includes a complement operation controller 146 and a D-flip-flop 147. The complement operation controller 146 may be implemented by using AND gates 146b and 146c and a D-latch 146a.

FIG. 6A will be described in detail below.

In the present example embodiment, the complement operation controller 146 of the counting unit CU<k> is provided with an inverted output /Q<k> of the counting unit CU<k> and the complement control signals BWI and BWI_C. The inverted output /Q<k> of the counting unit CU<k> is fed back to the complement operation controller 146 and an input terminal "D" of the D-flip-flop 147. The complement operation controller 146 stores the fed-back inverted output /Q<k> by using the D-latch 146a (refer to FIG. 6B). Accordingly, even if a level of the inverted output /Q<k> is unstable, a value of the first latched inverted output /Q<k> may be maintained. The inverted output /Q<k> maintained by the complement operation controller 146 is provided to a "SET" terminal and a "RESET" terminal of the D-flip-flop 147. Accordingly, even if the inverted output /Q<k> provided to the data input terminal "D" of the D-flip-flop 147 is unstable, a value of an output terminal "Q" of the D-flip-flop 147 may change depending on states of the "SET" terminal and the "RESET" terminal of the D-flip-flop 147. An output value Q<k−1> of a lower counting unit CU<k−1> is provided to a "CLK" input terminal of the D-flip-flop 147. The D-flip-flop 147 is triggered at a falling edge of the output value Q<k−1> of the counting unit CU<k−1>.

FIG. 6B will be described in detail below.

In the present example embodiment, the complement operation controller 146 may include the D-latch 146a and the AND gates 146b and 146c. The fed-back inverted signal /Q<k> is input to a data input terminal "D" of the D-latch 146a, and the first complement control signal BWI_C is input to a clock input terminal of the D-latch 146a. The fed-back inverted signal /Q<k> is stored in the D-latch 146a in synchronization with a rising edge of the first complement control signal BWI_C. A bit value of the inverted output /Q<k> may be stably maintained by the D-latch 146a until a next rising edge of the first complement control signal BWI_C.

The bit value of the inverted output /Q<k> that is stored in the D-latch 146a at the rising edge of the first complement control signal BWI_C is output to the D-flip-flop 147 in response to the second complement control signal BWI. Thus, the AND gate 146b receives a non-inverted output "Q" of the D-latch 146a and the second complement control signal BWI and output a set signal "S". The AND gate 146c receives an inverted output /Q of the D-latch 146a and the second complement control signal BWI and output a reset signal "R". Thus, the bit value stored in the D-latch 146a may be transferred to the "SET" terminal or the "RESET" terminal of the D-flip-flop 147 through the AND gates 146b and 146c depending on the second complement control signal BWI.

Figure 7:
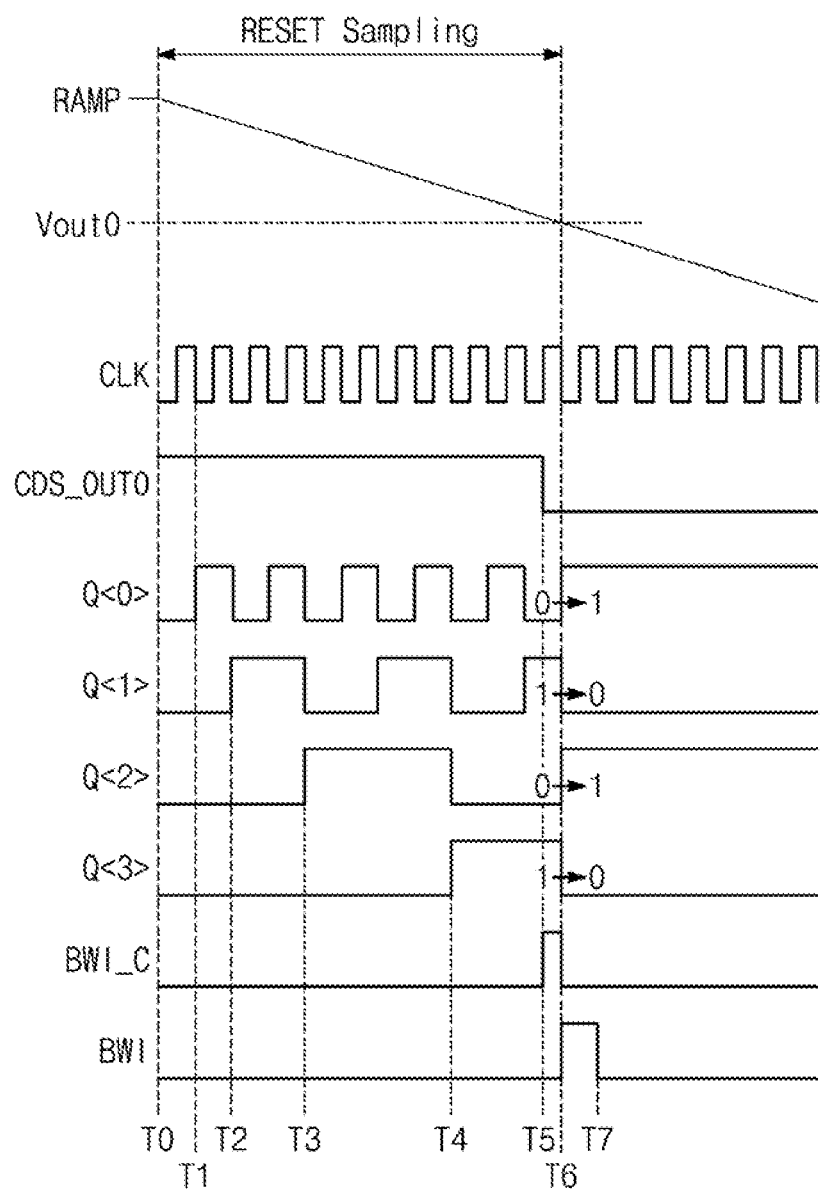
FIG. 7 is a timing diagram briefly illustrating a complement operation of a counter illustrated in FIG. 5.

FIG. 7 is a timing diagram briefly illustrating a complement operation of a counter illustrated in FIG. 5.

Referring to FIGS. 5 to 7, in response to the complement control signals BWI_C and BWI, the counter CNT_0 may invert a count value so as to be converted into the ones' complement. The complement control signals BWI_C and BWI maintain a low level until a time T5. In the case where a count starts, the sampling signal Vout0 may be maintained at a fixed value, and the ramp signal RAMP may fall with a given slope over time. A counting operation of the counter CNT_0 starts.

At a time T0, the CDS output signal CDS_OUT0, which is a result of comparing the ramp signal RAMP and the sampling signal Vout0, appears at high level. The clock signal CLK is transferred to the first counting unit CU<0> through the AND gate 141. The first counting unit CU<0> is triggered at a falling edge of the clock signal CLK. Accordingly, a least significant bit Q<0> is toggled to logic '1' at a time T1 corresponding to a first falling edge of the clock signal CLK, and is again toggled to logic '0' at a time T2 corresponding to a second falling edge of the clock signal CLK. The toggling operation of the first counting unit CU<0> may be performed while the clock signal CLK is provided to the first counting unit CU<0>. Thus, the toggling operation of the first counting unit CU<0> is performed in a period where the CDS output signal CDS_OUT0 is maintained at the high level.

At the time T2, the output bit value Q<0> of the first counting unit CU<0> has a high-to-low transition. Accordingly, the second counting unit CU<1> is triggered by the high-to-low transition of the output bit value Q<0> and starts to be toggled. Thus, a bit value Q<1> is toggled to logic '1' at the time T2 when the output bit value Q<0> has the high-to-low transition. The bit value Q<1> is again toggled to logic '0' at a time T3 when the output bit value Q<0> has a second high-to-low transition. The toggling operation of the second counting unit CU<1> may be performed while the CDS output signal CDS_OUT0 is maintained at the high level.

At the time T3, the output bit value Q<1> of the second counting unit CU<1> has a high-to-low transition. Accordingly, the third counting unit CU<2> is triggered by the high-to-low transition of the output bit value Q<1> and starts to be toggled. Thus, a bit value Q<2> is toggled to logic '1' at the time T3 when the output bit value Q<1> has the high-to-low transition. The bit value Q<2> is again toggled to logic '1' at a time T4 when the output bit value Q<1> has second high-to-low transition. The toggling operation of the third counting unit CU<2> may be performed while the CDS output signal CDS_OUT0 is maintained at the high level.

At the time T4, the output bit value Q<2> of the third counting unit CU<2> has a high-to-low transition. The fourth counting unit CU<3> is triggered by the high-to-low transition of the output bit value Q<2> and starts to be toggled. Thus, a bit value Q<3> is toggled to logic '1' at the time T4 when the output bit value Q<2> has the high-to-low transition. Although not illustrated in drawings, the bit value Q<3> is again toggled to logic '0' at a time the output bit value Q<2> has a second high-to-low transition.

At a time T5, the CDS output signal CDS_OUT0 transitions to the low level. The transfer of the clock signal CLK to the first counting unit CU<0> may be blocked, and the counting operation may be interrupted. In this case, a count value of the counter CNT_0 is "1010"(Q<3>, Q<2>, Q<1>, Q<0>). Under this condition, when the first complement control signal BWI_C transitions to the high level, an inverted output value of each of the counting units CU<0>, CU<1>, CU<2>, and CU<3> is stored in the D-latch 146a (refer to FIG. 6A) included in the complement operation controller 146.

At a time T6 when the second complement control signal BWI transitions to the high level, the inverted output value of each of the counting units CU<0>, CU<2>, CU<2>, and CU<3> is provided to the "SET" terminal and the "RESET" terminal of the D-flip-flop 147 (refer to FIG. 6A). At the time T5, the count value of the counter CNT_0, that is, "1010" is converted into the ones' complement, that is, "0101". At a time T7 when the second complement control signal BWI transitions to the low level, the counter CNT_0 may maintain the ones' complement thus obtained, that is, "0101".

Figure 8:
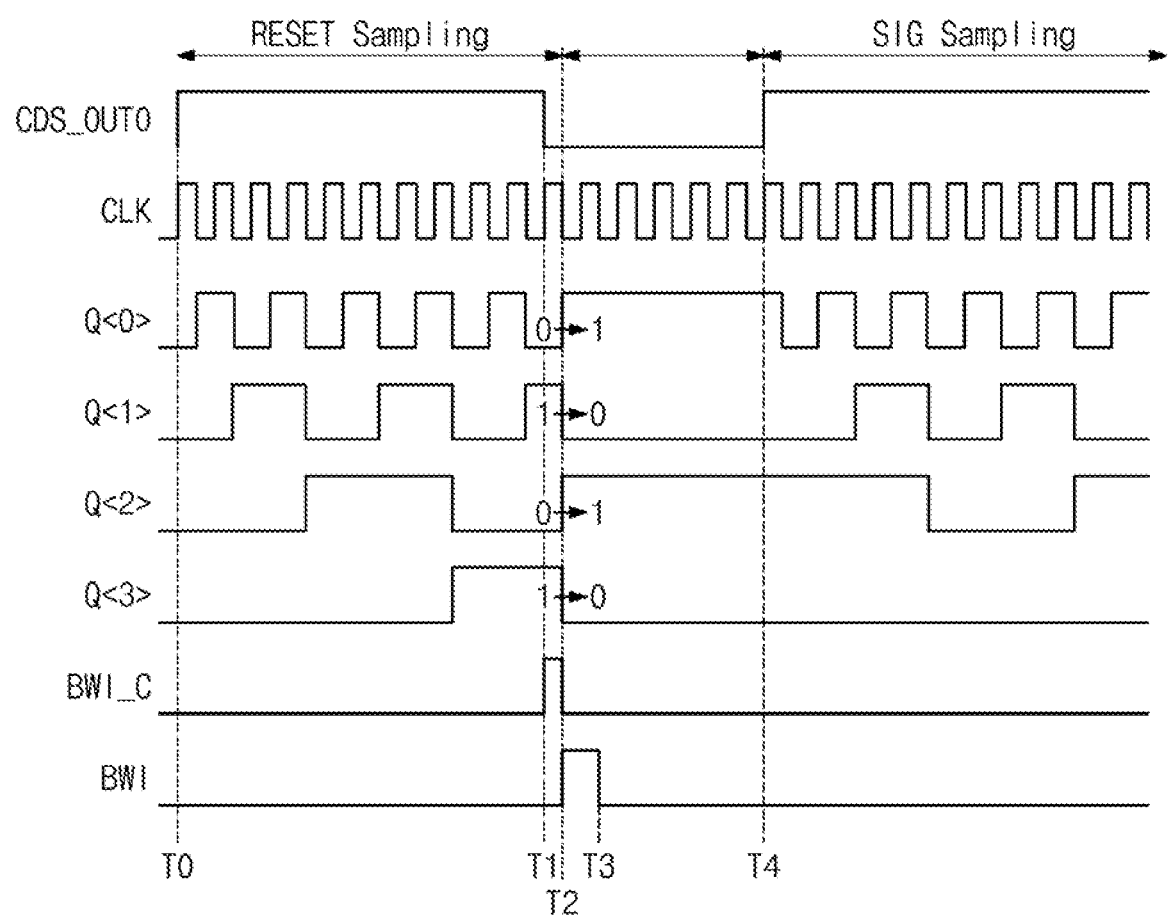
FIG. 8 is a timing diagram illustrating an operation of a counter according to an example embodiment for correlated double sampling.

FIG. 8 is a timing diagram illustrating an operation of a counter according to an example embodiment for correlated double sampling.

Referring to FIG. 8, according to an example embodiment, a counter may sample the reset signal RESET to obtain the complement, and may then process a correlated double sampling signal to sample the image signal SIG.

At a time T0, the sampling signal Vout0 corresponding to the reset signal RESET may be transferred to the comparator Comp0. As a result of comparing the ramp signal RAMP and the sampling signal Vout0, the CDS output signal CDS_OUT0 transitions to the high level. As the CDS output signal CDS_OUT0 transitions to the high level, the clock signal CLK is transferred to the first counting unit CU<0> through the AND gate 141. Afterwards, a high-level period of the CDS output signal CDS_OUT0 is counted by the counting units CU<0>, CU<1>, CU<2>, and CU<3>.

At a time T1, the CDS output signal CDS_OUT0 transitions to the low level. The transfer of the clock signal CLK to the first counting unit CU<0> may be blocked, and the counting operation of the counter CNT_0 may be interrupted. In this case, a count value of the counter CNT_0 is "1010"(Q<3>, Q<2>, Q<1>, Q<0>). Under this condition, when the first complement control signal BWI_C transitions to the high level, an inverted output value of each of the counting units CU<0>, CU<1>, CU<2>, and CU<3> is stored in the D-latch 146a (refer to FIG. 6B). However, there is no transfer of a signal to the D-flip-flop 147.

At a time T2 when the second complement control signal BWI transitions to the high level, the inverted output value stored in the D-latch 146a of each of the counting units CU<0>, CU<2>, CU<2>, and CU<3> is transferred to the D-flip-flop 147 (refer to FIG. 6A). As such, the count value of the counter CNT_0, that is, "1010" is converted into the ones' complement, that is, "0101".

At a time T3 when the second complement control signal BWI transitions to the low level, the counter CNT_0 may maintain the ones' complement of the count value thus obtained, that is, "0101".

At a time T4, the sampling signal Vout0 corresponding to the image signal SIG may be transferred to the comparator Comp0. As a result of comparing the ramp signal RAMP and the sampling signal Vout0, the CDS output signal CDS_OUT0 transitions to the high level. As the CDS output signal CDS_OUT0 transitions to the high level, the clock signal CLK is transferred to the first counting unit CU<0> through the AND gate 141. Afterwards, a high-level period of the CDS output signal CDS_OUT0 is counted by the counting units CU<0>, CU<1>, CU<2>, and CU<3>.

At the time T4, a count start value of the counter CNT_0 may be "0101" being the ones' complement of the count value of the reset signal RESET. The counter CNT_0 operates to add the count value of the image signal SIG to "0101" corresponding to a negative number. Accordingly, the count value corresponding to the reset signal RESET may be subtracted from the count value of the image signal SIG.

In the case where the correlated double sampling is performed in the above scheme, a correlated double sampling value may be easily converted into digital data without a separate memory for storing the count value of the reset signal RESET.

Figure 9:
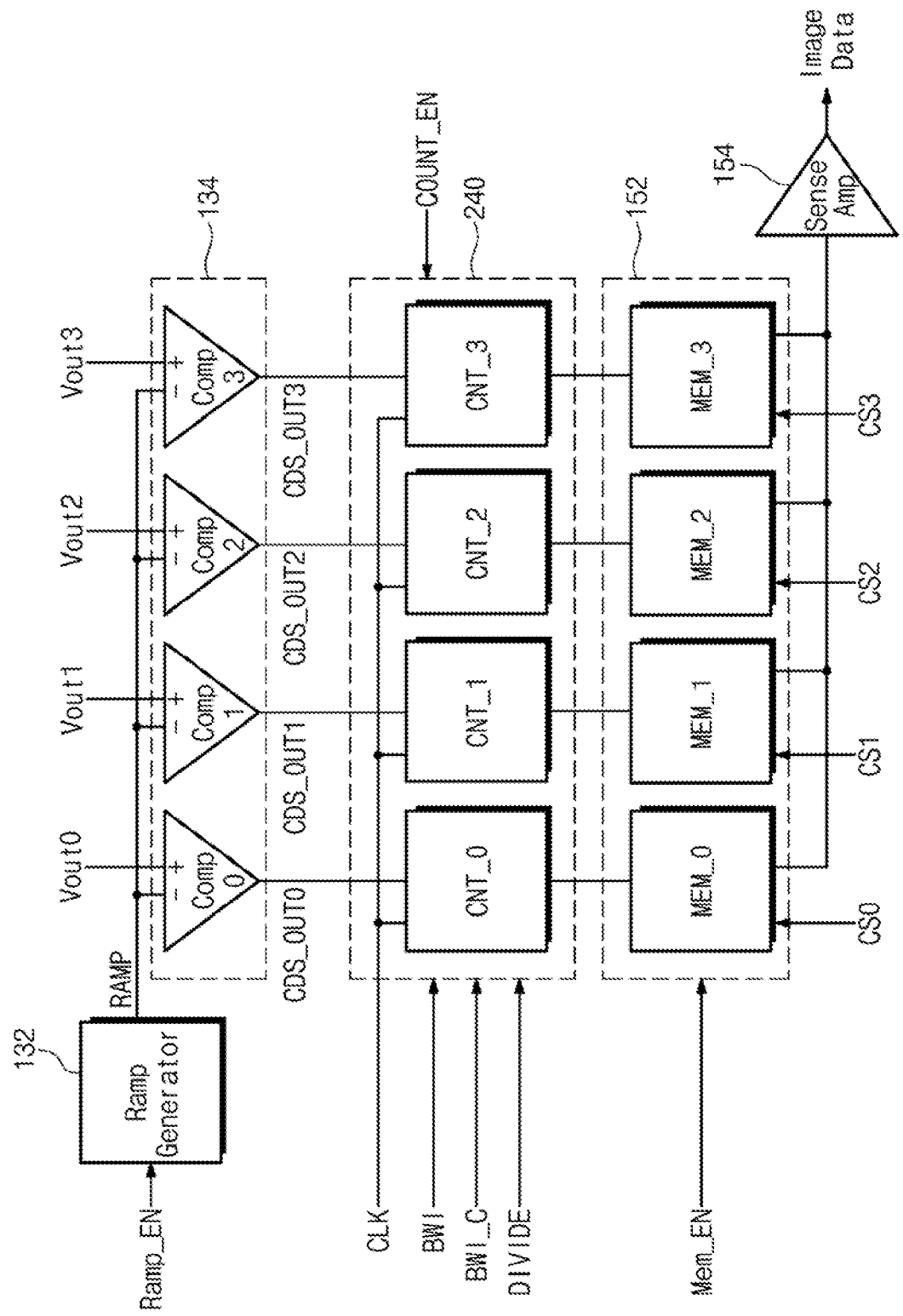
FIG. 9 is a block diagram illustrating an example structure of a correlated double sampler, an analog-to-digital converter, and an output buffer of FIG. 1, according to another example embodiment.

FIG. 9 is a block diagram illustrating an example structure of a correlated double sampler, an analog-to-digital converter, and an output buffer of FIG. 1, according to another example embodiment.

Referring to FIG. 9, the CDS 130 may include the ramp signal generator 132 and the comparators 134. An analog-to-digital converter 240 may include the plurality of counters CNT_0, CNT_1, and CNT_2, CNT_3. The output buffer 150 may include the memories MEM_0, MEM_1, MEM_2, and MEM_3, and the sense amplifier 154. The CDS 130 and the output buffer 150 may be identical to those of FIG. 4, and thus, additional description will be omitted to avoid redundancy.

In the present example embodiment, the analog-to-digital converter 240 includes the counters CNT_0, CNT_1, CNT_2, and CNT_3 that are provided with the clock signal CLK, the complement control signals BWI and BWI_C, and a division control signal DIVIDE. The counters CNT_0 to CNT_3 may count the CDS output signals CDS_OUT0 to CDS_OUT3 of the comparators 134 corresponding to the time-axis length information, and may convert the count results to digital information. The counters CNT_0 to CNT_3 may perform a stable complement operation on the count values even if complement control signals BWI and BWI_C are unstable due to the coupling. The counters CNT_0 to CNT_3 may divide a binary count value by "2" in response to the division control signal DIVIDE. A structure and an operation of the counters CNT_0 to CNT_3 will be more fully described below.

The structure of the analog-to-digital converter 240 including the counters CNT_0, CNT_1, CNT_2, and CNT_3 including the complement function and the division function according to an example embodiment is described above. Each of the counters CNT_0, CNT_1, CNT_2, and CNT_3 according to an example embodiment may be able to perform a stable complement operation even if the complement control signals BWI and BWI_C are unstable due to the coupling. In addition, through the division function, the analog-to-digital converter 240 may easily adopt a reset multiple sampling technique, and may reduce a magnitude of a noise.

Figure 10:
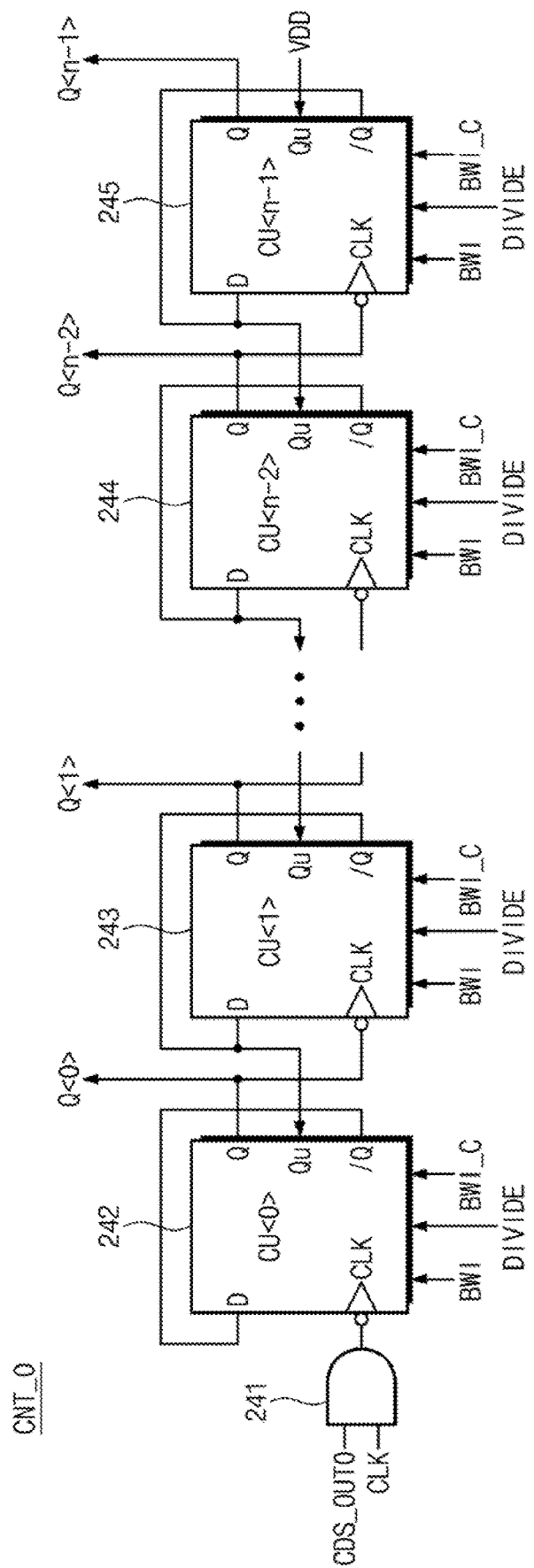
FIG. 10 is a circuit diagram illustrating a counter according to another example embodiment.

FIG. 10 is a circuit diagram illustrating a counter according to another example embodiment.

An example structure of the counter CNT_0 of the counters CNT_0 to CNT_3 of FIG. 9 is illustrated in FIG. 10. Structures of the remaining counters CNT_1, CNT_2, and CNT_3 may be identical to the structure of the counter CNT_0.

The counter CNT_0 may include an AND gate 241, and a plurality of counting units 242, 243, 244, and 245. The counter CNT_0 may be implemented with an asynchronous ripple counter in which one counting unit 242 is triggered by the clock signal CLK. The AND gate 241 transfers the clock signal CLK to a clock input terminal of the first counting unit 242 only in a high-level period of the CDS output signal CDS_OUT0.

The first counting unit 242 includes a D-flip-flop that is triggered at a falling edge. Thus, signals of output terminals Q and /Q are toggled at a falling edge of an input clock of the first counting unit 242. The inverted output terminal /Q is connected to a data input terminal "D" of the first counting unit 242. Accordingly, the first counting unit 242 outputs a least significant bit Q<0> that is repeatedly toggled in synchronization with a falling edge of the input clock. The first counting unit 242 may invert and output the latched data in response to the complement control signals BWI and BWI_C. The first counting unit 242 may perform a division operation of dividing the latched binary data by "2" in response to the division control signal DIVIDE. Functions of the second to fourth counting units 243 to 245 are substantially identical to the function of the first counting unit 242.

Through the above function, the counter CNT_0 may perform a multiple sampling operation of sampling the image signal SIG and the reset signal RESET a plurality of times and outputting an average value. For example, in the case where the image signal SIG and two reset signals REF1 and REF2 are sampled, finally output image data may be "(SIG−(REF1+REF2)/2". In this case, a reset noise may decrease as much as 1/root(2) times, thus implementing a low-noise image sensor. Thus, the division function may divide a count value by "2" for calculating an average value. The counters CNT_0, CNT_1, CNT_2, and CNT_3 included in the analog-to-digital converter 240 according to an example embodiment may divide a count value in response to the division control signal DIVIDE.

Figure 11A:
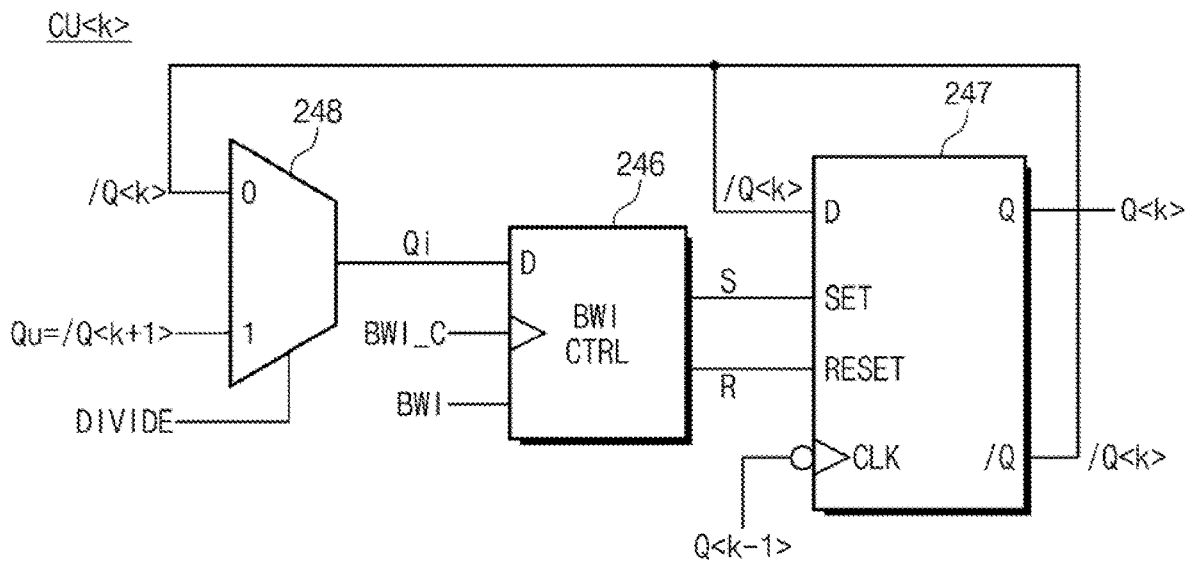
FIGS. 11A and 11B are block diagrams illustrating a structure of a counting unit of FIG. 10.
Figure 11B:
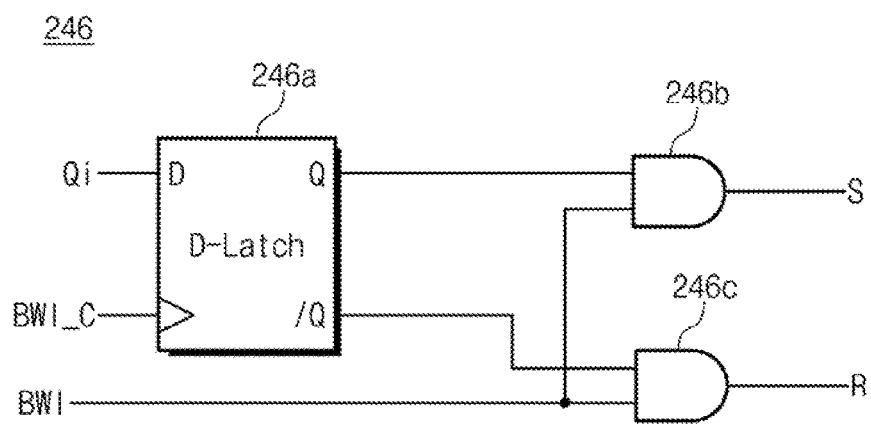

FIGS. 11A and 11B are block diagrams illustrating a structure of a counting unit of FIG. 10.

Referring to FIGS. 11A and 11B, a counting unit CU<k> that corresponds to one of the counting units CU<0> to CU<n−1> constituting the counter CNT_0 includes a multiplexer 248, a complement operation controller 246, and a D-flip-flop 247. The complement operation controller 246 may be implemented by using AND gates 246b and 246c and a D-latch 246a.

FIG. 11A will be described in detail below.

In the present example embodiment, the multiplexer 248 selects one of an inverted output /Q<k> of the counting unit CU<k> and an inverted output Qu (=/Q<k+1>) of the counting unit CU<k+1> corresponding to an upper bit, under control of the division control signal DIVIDE. A data signal Qi, which is selected by the multiplexer 248, is provided to an input terminal "D" of the complement operation controller 246.

When the division control signal DIVIDE is '0', the multiplexer 248 selects the inverted output /Q<k> of the counting unit CU<k>. When the inverted output /Q<k> is provided to the input terminal "D" of the complement operation controller 246, the complement operation controller 246 and the D-flip-flop 247 may perform the same complement operation as the counting unit CU<k> of FIG. 6A.

For the complement operation, the complement operation controller 246 is provided with the fed-back inverted output /Q<k> of the counting unit CU<k> and the complement control signals BWI and BWI_C. The inverted output /Q<k> is fed back to the complement operation controller 246 and an input terminal "D" of the D-flip-flop 247. The complement operation controller 246 stores the fed-back inverted output /Q<k> using the D-latch 146a (refer to FIG. 11B). Accordingly, even if a level of the inverted output /Q<k> is unstable, a value of the latched inverted output /Q<k> may be maintained. The inverted output /Q<k> maintained by the complement operation controller 246 is provided to a "SET" terminal and a "RESET" terminal of the D-flip-flop 247. Accordingly, even if the inverted output /Q<k> provided to a data input terminal "D" of the D-flip-flop 247 is unstable, a value of an output terminal "Q" of the D-flip-flop 247 may change depending on states of the "SET" terminal and the "RESET" terminal of the D-flip-flop 147. A non-inverted output Q<k−1> of a lower counting unit CU<k−1> is provided to a "CLK" input terminal of the D-flip-flop 247. The D-flip-flop 247 is triggered at a falling edge of the non-inverted output Q<k−1>.

When the division control signal DIVIDE is '1', the multiplexer 248 selects the inverted output /Q<k+1> of the counting unit CU<k+1> corresponding to an upper count value Qu. The complement operation controller 246 and the D-flip-flop 247 may perform an operation of latching the upper count value Qu. In a binary operation, a shift to a lower bit corresponds to an operation of dividing a count value by "2". Accordingly, in the counter CNT_0, the complement operation and the division operation are performed through the D-flip-flops 247 by shifting the inverted count value /Q<k+1> of the upper counting unit CU<k+1> to the lower counting unit CU<k>.

Referring to FIG. 11B, the complement operation controller 246 may include the D-latch 246a and the AND gates 246b and 246c. The fed-back inverted signal /Q<k> is input to a data input terminal "D" of the D-latch 246a, and the first complement control signal BWI_C is input to a clock input terminal of the D-latch 246a. The inverted output /Q<k> is stored in the D-latch 246a in synchronization with a rising edge of the first complement control signal BWI_C. A bit value of the inverted output /Q<k> may be stably maintained by the D-latch 246a until a next rising edge of the first complement control signal BWI_C.

The bit value of the inverted output /Q<k> that is stored in the D-latch 246a at the rising edge of the first complement control signal BWI_C is output to the D-flip-flop 247 in response to the second complement control signal BWI. Thus, the AND gate 246b receives a non-inverted output "Q" of the D-latch 246a and the second complement control signal BWI and output a set signal "S". The AND gate 246c receives an inverted output /Q of the D-latch 246a and the second complement control signal BWI and output a reset signal "R". Thus, the bit value stored in the D-latch 246a may be transferred to the "SET" and "RESET" terminals of the D-flip-flop 247 through the AND gates 246b and 246c depending on the second complement control signal BWI.

The complement operation controller 246 may selectively perform the division operation or the complement operation depending on the input data Qi.

Figure 12:
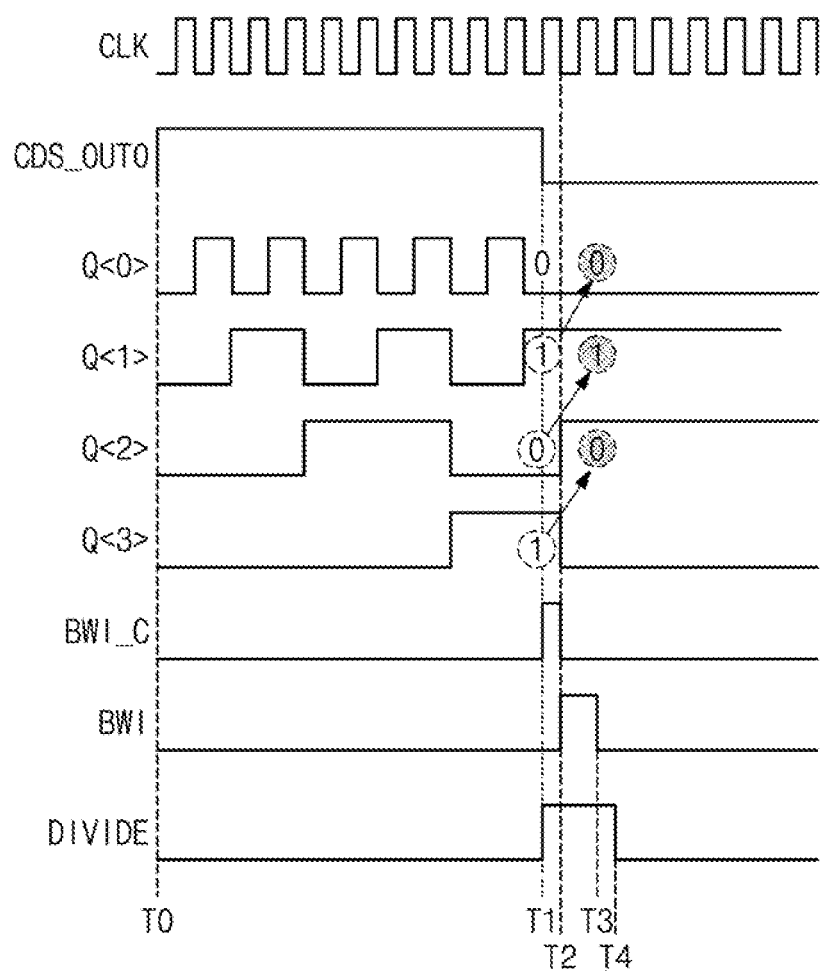
FIG. 12 is a timing diagram illustrating a division operation performed by a counter of FIG. 10.

FIG. 12 is a timing diagram illustrating a division operation performed by a counter of FIG. 10.

Referring to FIG. 12, in response to the complement control signals BWI_C and BWI and the division control signal DIVIDE, the counter CNT_0 may invert a count value or may perform a division operation on the count value.

At a time T0, the CDS output signal CDS_OUT0, which is a result of comparing the ramp signal RAMP and the sampling signal Vout0, transitions to the high level. The clock signal CLK is transferred to the first counting unit CU<0> through the AND gate 241 (refer to FIG. 10). The first counting unit CU<0> is triggered at a falling edge of the clock signal CLK. Accordingly, the counting operation of the counter CNT_0 may start from a time when the clock signal CLK transitions to the low level. Thus, count values Q<0>, Q<1>, Q<2>, and Q<3> of the counting units CU<0>, CU<1>, CU<2>, and CU<3> are counted up.

At a time T1, the CDS output signal CDS_OUT0 transitions to the low level, and the division control signal DIVIDE transitions to the high level. The transfer of the clock signal CLK may be blocked, and the counting operation of the counter CNT_0 may be interrupted. A count value of the counter CNT_0 is "1010"(Q<3>, Q<2>, Q<1>, Q<0>). Under this condition, to perform the complement operation and the division operation, first, when the first complement control signal BWI_C transitions to the high level, an inverted output value of each of the counting units CU<0>, CU<1>, CU<2>, and CU<3> is stored in the D-latch 246a (refer to FIG. 11A). In addition, in response to a low-to-high transition of the division control signal DIVIDE, the multiplexer 248 (refer to FIG. 11A) of each of the counting units CU<k> may select the inverted count value /Q<k+1> of the counting unit CU<k+1> corresponding to the upper count value Qu.

At a time T2 when the second complement control signal BWI transitions to the high level, the inverted output value of each of the counting units CU<0>, CU<2>, CU<2>, and CU<3> is provided to the "SET" terminal and the "RESET" terminal of the D-flip-flop 247 (refer to FIG. 11A). The count value of the counter CNT_0, that is, "1010" is converted into the ones' complement, that is, "0101". At the same time, because the division control signal DIVIDE is '1', the multiplexer 248 selects the inverted output /Q<k+1> of the counting unit CU<k+1> corresponding to the upper count value Qu. The complement operation controller 246 and the D-flip-flop 247 may perform an operation of latching the upper count value Qu. Accordingly, the counting units CU<0>, CU<1>, CU<2>, and CU<3> perform a shift operation on "0101" being the ones' complement, such that an upper bit is shifted to a lower bit. In this case, a least significant bit '1' of "0101" being the ones' complement may be invalidated, and the remaining three bits "010" may be maintained at the counter CNT_0. This operation corresponds to the division operation of dividing the reset signal RESET converted into a negative number through the complement operation, by "2".

Afterwards, the second complement control signal BWI transitions to the low level at a time T3, the division control signal DIVIDE transitions to the low level at a time T4. The counter CNT_0 may maintain the divided ones' complement thus obtained, that is, "010" as the count value.

Figure 13A:
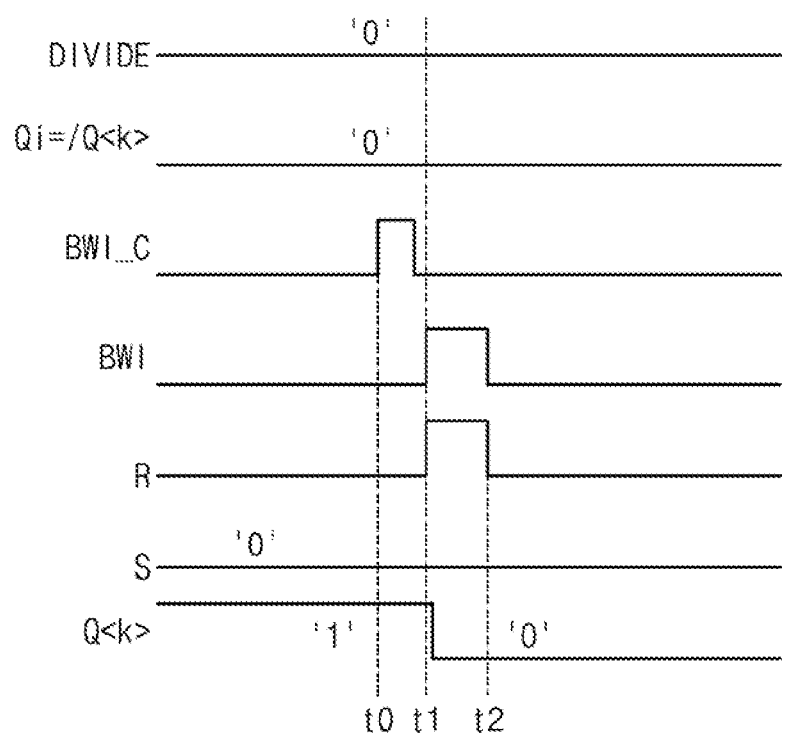
FIGS. 13A and 13B are timing diagrams illustrating operations of a counting unit performing only a complement operation.
Figure 13B:
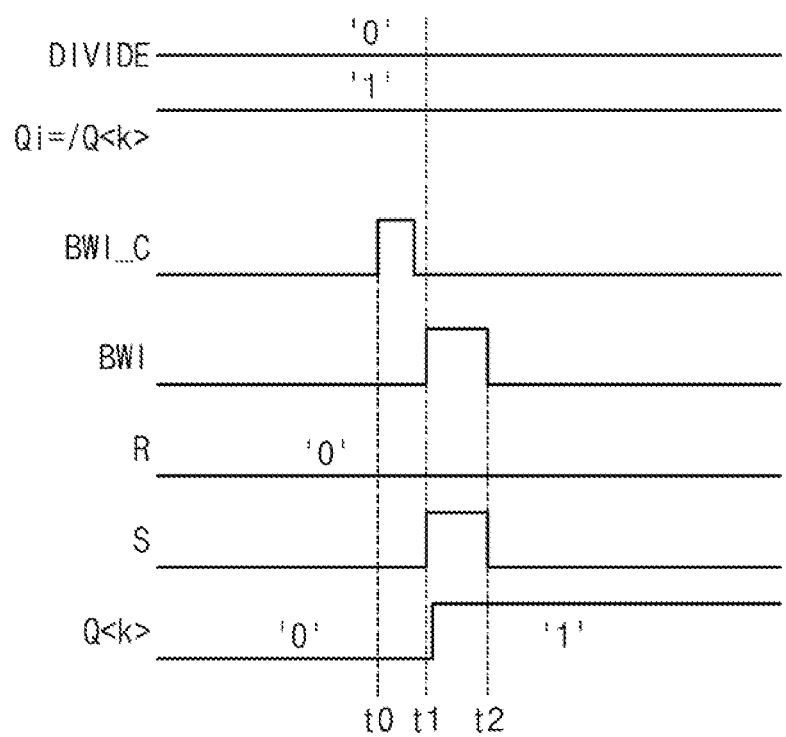

FIGS. 13A and 13B are timing diagrams illustrating operations of the counting unit CU<k> performing only a complement operation.

FIG. 13A illustrates the complement operation in the case where a current data value Q<k> of the counting unit CU<k> is logic '1', and FIG. 13B illustrates the complement operation in the case where the current data value Q<k> of the counting unit CU<k> is logic '0'.

Referring to FIG. 13A, the current data value Q<k> of the counting unit CU<k> is logic '1', and the division control signal DIVIDE maintains the low level '0'. The multiplexer 248 (refer to FIG. 11A) may select the fed-back inverted count value /Q<k> (='0') so as to be provided as an input Qi of the complement operation controller 246.

At a time t0, the first complement control signal BWI_C transitions to the high level. Logic '0' corresponding to the input Qi is stored in the D-latch 246a (refer to FIG. 11B) in the complement operation controller 246 (refer to FIG. 11B) in synchronization with a rising edge of the first complement control signal BWI_C.

At a time t1, the second complement control signal BWI transitions to the high level. During a high-level period t1 to t2 of the second complement control signal BWI, logic '0' stored in the D-latch 246a (refer to FIG. 11B) of the complement operation controller 246 (refer to FIG. 11B) may be provided to the "SET" terminal and the "RESET" terminal of the D-flip-flop 247 through the AND gates 246b and 246c (in this case, SET=0 and RESET=1). As such, the output value Q<k> of the D-flip-flop 247 may transition to a reset value, that is, logic '0'.

Referring to FIG. 13B, the division control signal DIVIDE is at the low level ('0'), and the current data value Q<k> of the counting unit CU<k> is logic '0'. The multiplexer 248 (refer to FIG. 11A) may select the fed-back inverted count value /Q<k> (='1') so as to be provided as the input Qi of the complement operation controller 246. As such, logic '1' is stored in the D-latch 246a (refer to FIG. 11B) of the complement operation controller 246 (refer to FIG. 11B).

At a time t0, the first complement control signal BWI_C transitions to the high level. Logic '1' corresponding to the input Qi is stored in the D-latch 246a (refer to FIG. 11B) of the complement operation controller 246 (refer to FIG. 11B) in synchronization with a rising edge of the first complement control signal BWI_C.

At a time t1, the second complement control signal BWI transitions to the high level. During a high-level period t1 to t2 of the second complement control signal BWI, logic '1' stored in the D-latch 246a (refer to FIG. 11B) of the complement operation controller 246 (refer to FIG. 11B) may be provided to the "SET" terminal and the "RESET" terminal of the D-flip-flop 247 through the AND gates 246b and 246c (in this case, SET=1 and RESET=0). As such, the output value Q<k> of the D-flip-flop 247 may transition to a set value, that is, logic '1'.

Figure 14A:
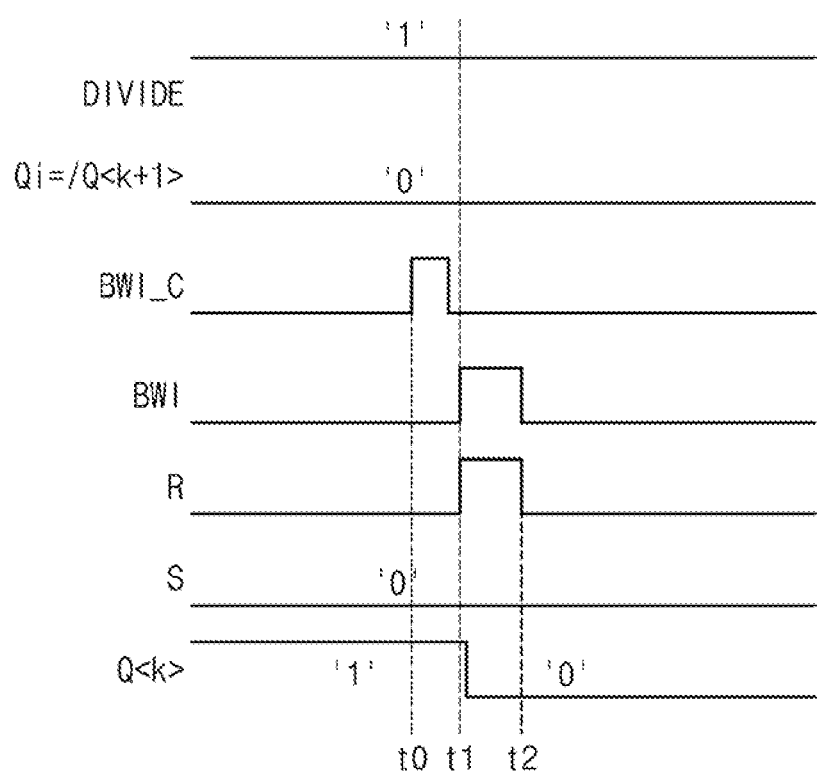
FIGS. 14A and 14B are timing diagrams illustrating operations of a counting unit performing both a complement operation and a division operation.
Figure 14B:
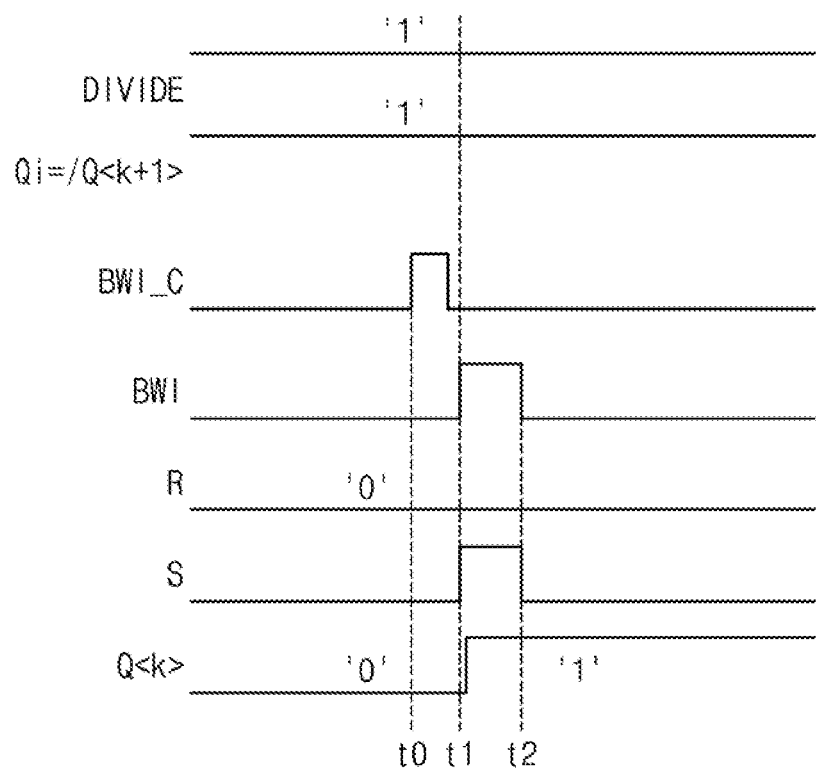

FIGS. 14A and 14B are timing diagrams illustrating operations of the counting unit CU<k> performing both a complement operation and a division operation.

FIG. 14A illustrates the complement operation and the division operation in the case where a count value Q<k> of the counting unit CU<k> is logic '1' and an inverted count value /Q<k+1> of the counting unit CU<k+1> is logic '0'. FIG. 14B illustrates the complement operation and the division operation in the case where the current count value Q<k> of the counting unit CU<k> is logic '0' and the inverted count value /Q<k+1> of the counting unit CU<k+1> is logic '1'.

Referring to FIG. 14A, when the division control signal DIVIDE is at the high level (or logic '1'), the multiplexer 248 (refer to FIG. 11A) selects the inverted output /Q<k+1> of the counting unit CU<k+1> corresponding to the upper count value Qu. Accordingly, regardless to the current count value Q<k> (='1') of the counting unit CU<k>, the inverted count value /Q<k+1> (='0') of the counting unit CU<k+1> is provided as the input Qi of the complement operation controller 246.

At a time to, logic '1' corresponding to the inverted count value /Q<k+1> (='0') is stored in the D-latch 246a (refer to FIG. 11B) of the complement operation controller 246 (refer to FIG. 11B) in synchronization with a rising edge of the first complement control signal BWI_C.

At a time t1, the second complement control signal BWI may transition to the high level. In this case, during a high-level period t1 to t2 of the second complement control signal BWI, logic '0' stored in the D-latch 246a (refer to FIG. 11B) of the complement operation controller 246 (refer to FIG. 11B) may be provided to the "SET" terminal and the "RESET" terminal of the D-flip-flop 247 through the AND gates 246b and 246c (in this case, SET=0 and RESET=1). As such, the output value Q<k> of the D-flip-flop 247 may transition to a reset value, that is, logic '0'.

The inverted upper count value /Q<k+1> may be shifted to the lower count value Q<k> in the above manner. As the inverted upper count value /Q<k+1> is shifted to the lower count value Q<k>, the complement operation and the division operation may be performed together.

Referring to FIG. 14B, when the division control signal DIVIDE is at the high level (or logic '1'), the multiplexer 248 (refer to FIG. 11A) selects the inverted output /Q<k+1> (='0') of the counting unit CU<k+1> corresponding to the upper count value Qu. Accordingly, regardless to the current count value Q<k> (='1') of the counting unit CU<k>, the inverted count value /Q<k+1> (='1') of the counting unit CU<k+1> is provided as the input Qi of the complement operation controller 246.

At a time to, logic '1' corresponding to the inverted count value /Q<k+1> is stored in the D-latch 246a (refer to FIG. 11B) of the complement operation controller 246 (refer to FIG. 11B) in synchronization with a rising edge of the first complement control signal BWI_C.

At a time t1, the second complement control signal BWI may transition to the high level. In this case, during a high-level period t1 to t2 of the second complement control signal BWI, logic '1' stored in the D-latch 246a (refer to FIG. 11B) of the complement operation controller 246 (refer to FIG. 11B) may be provided to the "SET" terminal and the "RESET" terminal of the D-flip-flop 247 through the AND gates 246b and 246c (in this case, SET=1 and RESET=0). As such, the output value Q<k> of the D-flip-flop 247 may transition to a set value, that is, logic '1'.

The inverted upper count value /Q<k+1> may be shifted to the lower count value Q<k> in the above manner. As the inverted upper count value /Q<k+1> is shifted to the lower count value Q<k>, the complement operation and the division operation may be performed together.

Figure 15:
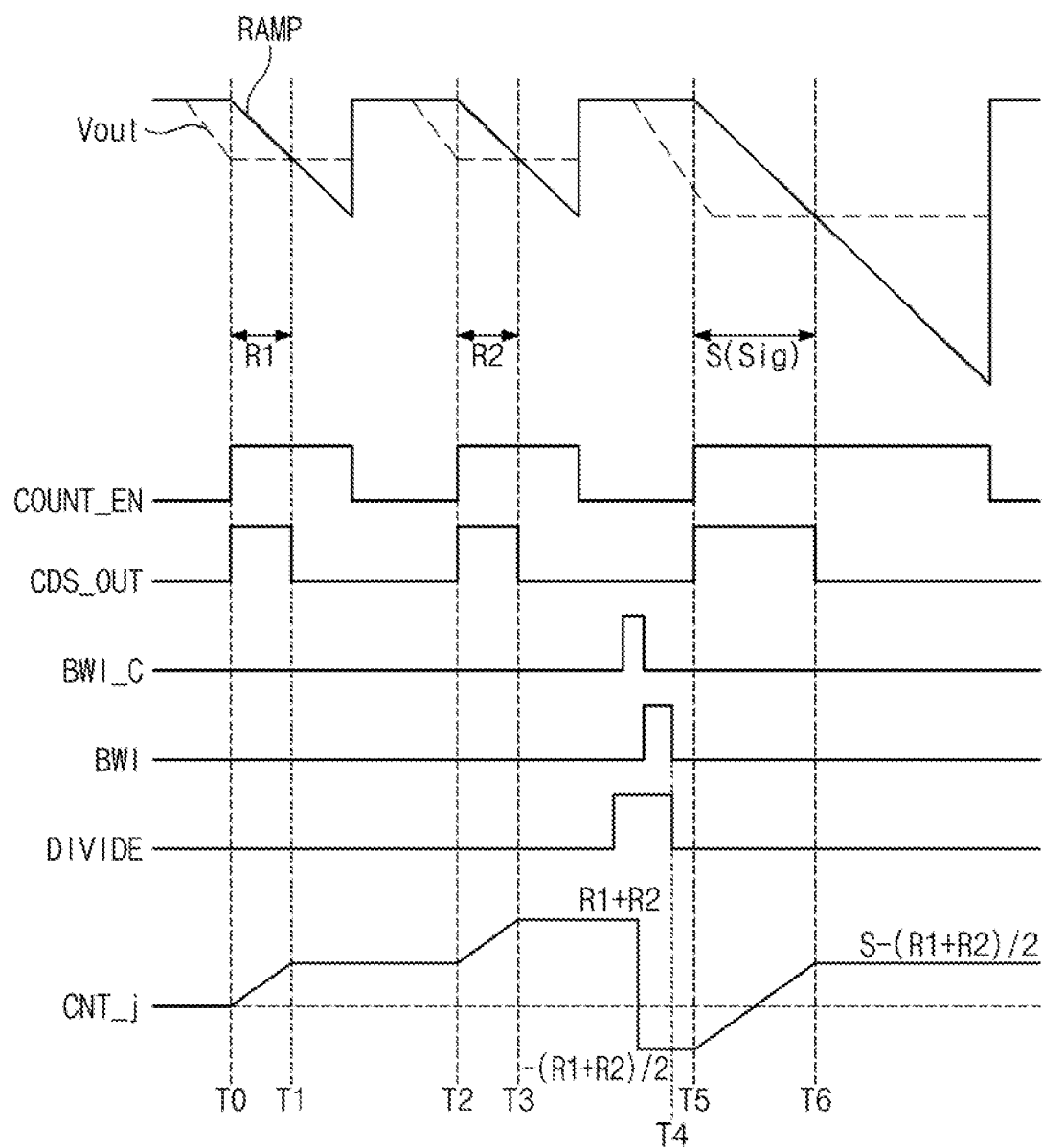
FIG. 15 is a timing diagram illustrating a reset multiple sampling operation using a counter according to an example embodiment.

FIG. 15 is a timing diagram illustrating a reset multiple sampling operation using a counter according to an example embodiment.

In a multiple sampling operation in which two reset signals R1 and R2 are sampled and an image signal "S" is sampled, an operation of a counter CNT_j according to an example embodiment will be described with reference to FIG. 15.

At a time T0, as the ramp signal RAMP is activated and a counter enable signal COUNT_EN is activated, the conversion of a level of the sampling signal Vout corresponding to the first reset signal R1 is initiated. In the case where the CDS output signal CDS_OUT maintains the high level until a time when a level of the sampling signal Vout and a level of the ramp signal RAMP cross each other, a count value of the counter CNT_j increases up to a level of "R1".

At a time T1 when the CDS output signal CDS_OUT transitions to the low level, the counting operation of the counter CNT_j is interrupted, and the count value maintains "R1".

At a time T2, as the ramp signal RAMP is activated and the counter enable signal COUNT_EN is activated, the conversion of a level of the sampling signal Vout corresponding to the second reset signal R2 is initiated. In the case where the CDS output signal CDS_OUT maintains the high level until a time when a level of the sampling signal Vout and a level of the ramp signal RAMP cross each other, a counting value of the counter CNT_j increases up to a level of "R1+R2".

At a time T3, the CDS output signal CDS_OUT transitions to the low level. The counting value of the counter CNT_j may maintain the level of "R1+R2".

During a time period from T3 to T4 where the second complement control signal BWI transitions to the high level after the division control signal DIVIDE and the first complement control signal BWI_C transition to the high level, the complement operation and the division operation are performed on the reset signal "R1+R2". Thus, the sampled reset signal "R1+R2" is converted into a negative number "−(R1+R2)" through the complement operation. Also, an average value of the reset signal corresponding to "−(R1+R2)" may be obtained through the division operation.

At a time T5, the image signal "S" is sampled by using "−(R1+R2)" as a start count value. During a high-level period of the CDS output signal CDS_OUT corresponding to a first image signal, the counter CNTj performs a count-up operation from "−(R1+R2)".

At a time T6, a count value corresponding to "S−(R1+R2)/2" may be output from the counter CNT_j as a result of the count-up operation. The average value "−(R1+R2)/2" of the reset signal stored in a memory is applied to the counter CNT_j. As such, a count value corresponding to "S−(R1+R2)/2" may be set at the counter CNT_j.

In the case of using the above-described reset multiple sampling technique, the counter according to an example embodiment may easily perform a multiple sampling operation by performing the complement operation and the division operation at the same time. In addition, it may be possible to implement a low-noise image sensor through the division operation of a multiple-sampled reset signal.

Figure 16A:
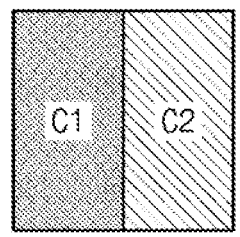
FIGS. 16A and 16B are diagrams illustrating a structure of a pixel sensor of an image sensor for performing multiple sampling by using a counter according to an example embodiment.
Figure 16B:
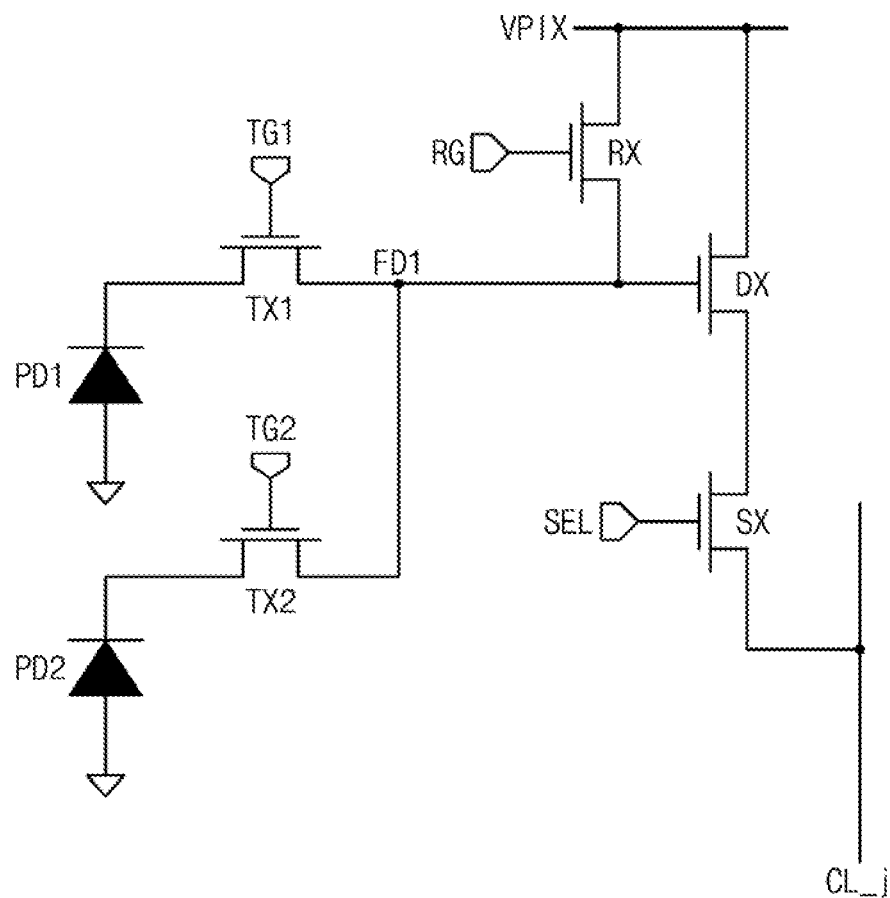

FIGS. 16A and 16B are diagrams illustrating a structure of a pixel sensor of an image sensor for performing multiple sampling by using a counter according to an example embodiment.

Referring to FIGS. 16A and 16B, a pixel sensor 211 may be configured to include at least two photoelectric conversion elements. For example, the pixel sensor 211 may be divided into a first sub-pixel C1 and a second sub-pixel C2. The first sub-pixel C1 may include a first photoelectric conversion element PD1 and a first transfer transistor TX1. The second sub-pixel C2 may include a second photoelectric conversion element PD2 and a second transfer transistor TX2. The first and second transfer transistors TX1 and TX2 may share the floating diffusion area FD.

A gate electrode of the first transfer transistor TX1 may be connected to a first charge transfer line TG1, and may transfer charges accumulated at the first photoelectric conversion element PD1 to the floating diffusion area FD in response to a first charge transfer signal. A gate electrode of the second transfer transistor TX2 may be connected to a second charge transfer line TG2, and may transfer charges accumulated at the second photoelectric conversion element PD2 to the floating diffusion area FD in response to a second charge transfer signal.

In a multiple sampling operation, the image signals SIG are sequentially generated by the first sub-pixel C1 and the second sub-pixel C2. Accordingly, an average value of the image signals obtained through the multiple sampling operation may be easily calculated through the complement operation and the division operation that are performed at the counter according to an example embodiment.

Figure 17:
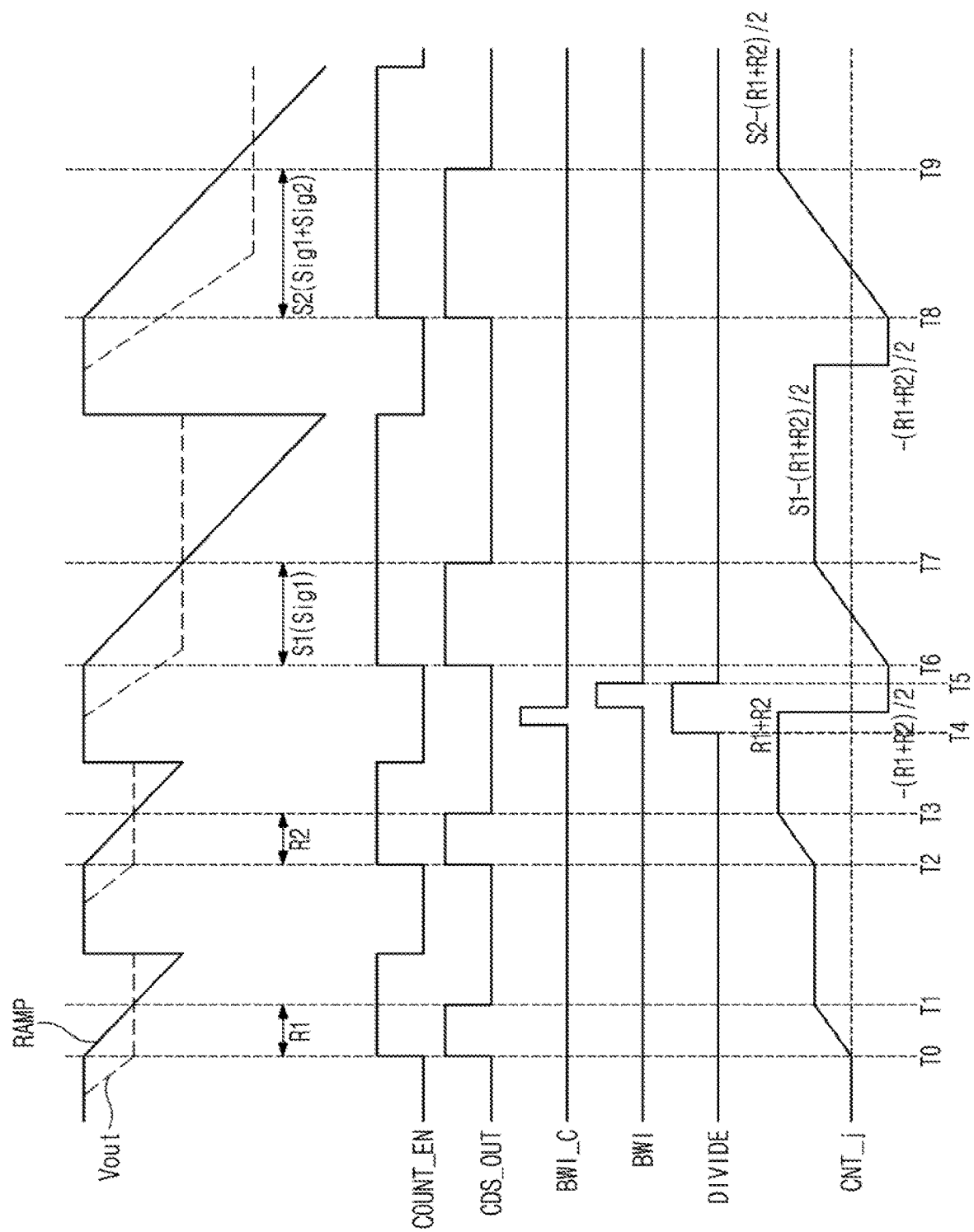
FIG. 17 is a timing diagram illustrating an analog-to-digital converting operation of a reset multiple sampling scheme using a counter according to an example embodiment.

FIG. 17 is a timing diagram illustrating an analog-to-digital converting operation of a reset multiple sampling scheme using a counter according to an example embodiment, in the pixel structure illustrated in FIG. 16B.

In a sampling operation in which two reset signals R1 and R2 are multiple-sampled and two image signals S1 and S2 are sampled, an operation of the counter CNT_j according to an example embodiment will be described with reference to FIG. 17. The multiple sampling method may be applied to pixel structures illustrated in FIGS. 16A and 16B or to other pixel structures.

At a time T0, as the ramp signal RAMP is activated and the counter enable signal COUNT_EN is activated, the conversion of a level of the sampling signal Vout corresponding to the first reset signal R1 is initiated. In the case where the CDS output signal CDS_OUT maintains the high level until a time when a level of the sampling signal Vout and a level of the ramp signal RAMP cross each other, a counting value of the counter CNT_j increases up to a level of "R1".

At a time T1 when the CDS output signal CDS_OUT transitions to the low level, the counting operation of the counter CNT_j is interrupted, and the count value maintains "R1".

At a time T2, as the ramp signal RAMP is activated and the counter enable signal COUNT_EN is activated, the conversion of a level of the sampling signal Vout corresponding to the second reset signal R2 is initiated. In the case where the CDS output signal CDS_OUT maintains the high level until a time when a level of the sampling signal Vout and a level of the ramp signal RAMP cross each other, a count value of the counter CNT_j increases up to a level of "R1+R2".

At a time T3, the CDS output signal CDS_OUT transitions to the low level. The count value of the counter CNT_j may maintain the level of "R1+R2".

At a time T4, the second complement control signal BWI transitions to the high level after the division control signal DIVIDE and the first complement control signal BWI_C transition to the high level. The complement operation and the division operation are performed on the reset signal "R1+R2" maintained at the counter CNT_j. Thus, the sampled reset signal "R1+R2" is converted into a negative number "-(R1+R2)" through the complement operation. Also, at the time T4, an average value of the reset signal corresponding to "-(R1+R2)/2" may be obtained through the division operation. In an embodiment, the average value "-(R1+R2)/2" of the reset signal corresponding to a negative number may be stored in a register or memory that is separately provided.

At a time T5 when the division control signal DIVIDE transitions to the low level, the average value "-(R1+R2)/2" of the reset signal may be maintained at the counter CNT_j.

At a time T6, the first image signal S1 is sampled by using "-(R1+R2)/2" as a start count value. The first image signal S1 may be, for example, an image signal Sig1 sensed from the first sub-pixel C1 of FIG. 16A. During a high-level period of the CDS output signal CDS_OUT, the counter CNT_j performs a count-up operation from "-(R1+R2)/2" In this case, a count value may increase up to "S1-(R1+R2)/2" until a time T7. At the time T7, a count value corresponding to "S1-(R1+R2)/2" may be output from the counter CNT_j as a result of the count-up operation. When "S1-(R1+R2)/2" is completely output, between the time T7 and a time T8, the average value "-(R1+R2)/2" of the reset signal stored in the memory may be input to the counter CNT_j. As such, a count value corresponding to "-(R1+R2)/2" may be set at the counter CNT_j.

At the time T8, the second image signal S2 is sampled by using "-(R1+R2)/2" as a start count value. The second image signal S2 may be, for example, a sum of the image signals Sig1 and Sig2 sensed from the first sub-pixel C1 and the second sub-pixel C2 of FIG. 16A. During a high-level period of the CDS output signal CDS_OUT corresponding to the second image signal S2, the counter CNT_j performs a count-up operation from "-(R1+R2)/2" As such, a count value may increase up to "S2-(R1+R2)/2" at a time T9. Accordingly, "S2-(R1+R2)/2" may be output as a counted value.

In the case of using the above reset multiple sampling technique, the counter according to an example embodiment may easily perform a multiple sampling operation by performing the complement operation and the division operation at the same time.

Figure 18:
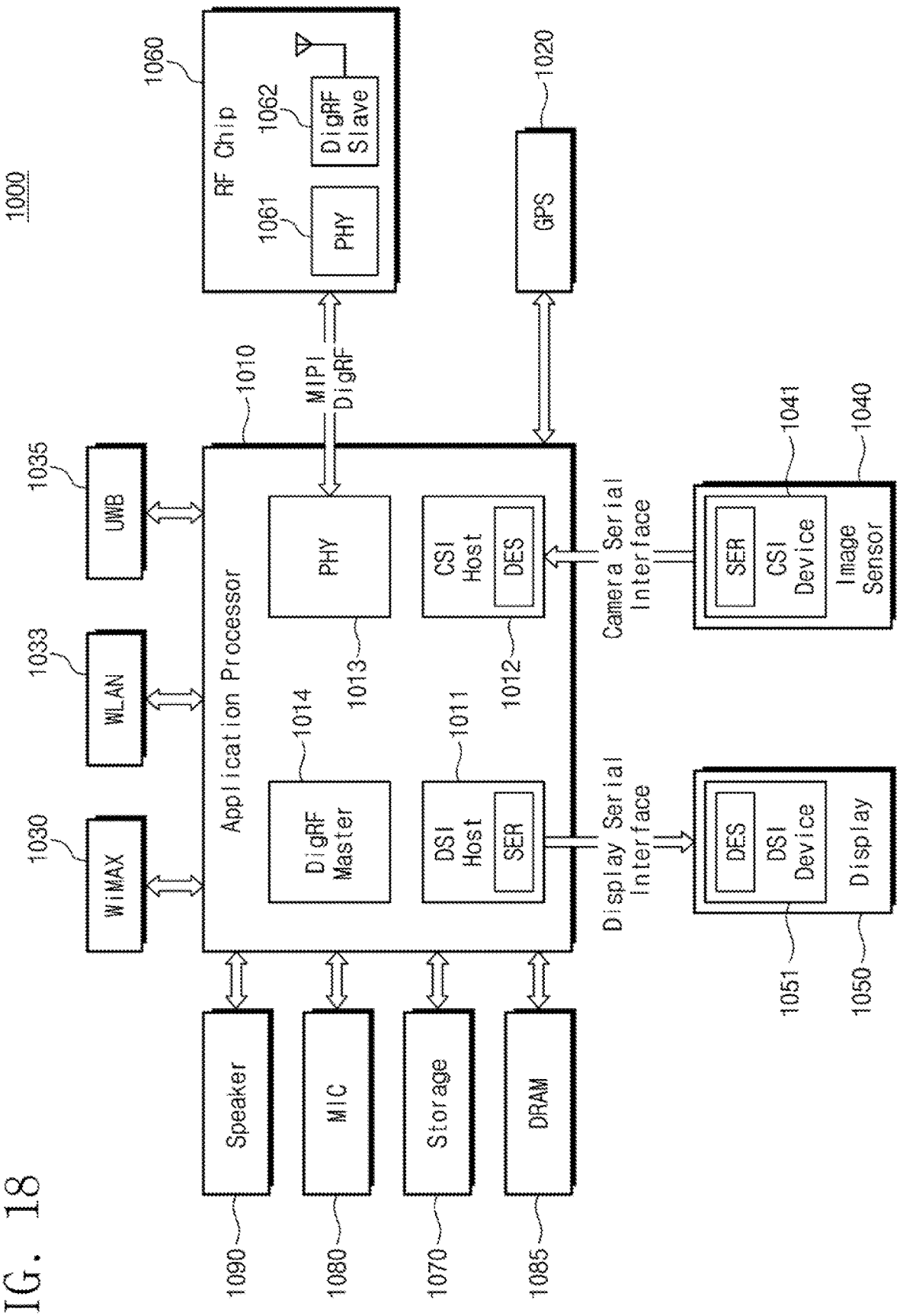
FIG. 18 is a block diagram illustrating an electronic system including an image sensor according to an example embodiment.

FIG. 18 is a block diagram illustrating an electronic system including an image sensor according to an example embodiment.

Referring to FIG. 18, an electronic system 1000 may be implemented with a data processing device, which uses or supports a mobile industry processor interface (MIPI), such as a mobile phone, a portable digital assistant (PDA), a personal media player (PMP), or a smartphone. The electronic system 1000 may include an application processor 1010, an image sensor 1040, and a display 1050.

A camera serial interface (CSI) host 1012 implemented in the application processor 1010 may perform serial communication with a CSI device 1041 of the image sensor 1040 through a CSI. In this case, an optical deserializer DES may be implemented in the CSI host 1012, and an optical serializer SER may be implemented in the CSI device 1041. The application processor 1010 may include an image signal processor (ISP) that performs auto white balancing.

A display serial interface (DSI) host 1011 implemented in the application processor 1010 may perform serial communication with a DSI device 1051 of the display 1050 through a DSI. In this case, for example, an optical serializer SER may be implemented in the DSI host 1011, and an optical deserializer DES may be implemented in the DSI device 1051.

The electronic system 1000 may further include a radio frequency (RF) chip 1060 capable of communicating with the application processor 1010. A physical layer (PHY) 1013 of the application processor 1010 and a physical layer (PHY) 1061 of the RF chip 1060 may exchange data in compliance with an MIPI DigRF interface.

The electronic system 1000 may further include a GPS 1020, storage 1070, a microphone 1080, a DRAM 1085, and a speaker 1090, and the electronic system 1000 may communicate with an external device by using WiMAX 1030, WLAN 1033, UWB 1035, etc.

By way of summation and review, in an image sensor, data may be sampled in a way to subtract a count value corresponding to a reset signal RESET from a count value corresponding to an image signal SIG output from a pixel, for implementing a low noise device. The counter may use a function of a complement operation for subtracting the count value of the reset signal RESET. However, in a high-definition image sensor, a coupling influence between signal lines may be increased and the possibility of failure of a complement operation of the counter may increase.

Also, a counter having a division function is useful for applying a reset multiple sampling technique for low-noise implementation.

As described above, embodiments relate to a semiconductor device, and more particularly, relate to a counter capable of performing a complement operation and an image sensor including the same.

Embodiments may provide a counter having a division function capable of reducing the influence of coupling in a complement operation and applying a reset multiple sampling technique, and an image sensor including the same.

According to an example embodiment, a counter may be implemented that reduces the influence of coupling in a complement operation performed at an image sensor. According to an example embodiment, a counter including a division function used in a reset multiple sampling scheme and an image sensor including the counter may be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
a pixel sensor configured to sense an incident light and to output an analog sampling signal;
a sampling unit configured to compare the sampling signal and a ramp signal, and to output a comparison signal that is time-axis length information; and
a counter configured to count a length of the comparison signal in response to a clock signal, a first complement control signal, and a second complement control signal, wherein:
the counter includes:
a first AND gate configured to perform an AND operation on the comparison signal and the clock signal; and
a first counting unit triggered at a falling edge of an output of the first AND gate to output a first count value, and
the first counting unit includes:
a first complement operation controller configured to store an inverted first count value corresponding to an inverted version of the first count value in response to the first complement control signal, and to output the inverted first count value in response to the second complement control signal; and
a first D-flip-flop that is set or reset depending on the inverted first count value output from the first complement operation controller, and configured to output the first count value.

2. The image sensor of claim 1, wherein the first complement operation controller includes:
a D-latch configured to store the inverted first count value in response to the first complement control signal; and
a logic gate configured to transfer the inverted first count value stored in the D-latch to the first D-flip-flop in response to the second complement control signal.

3. The image sensor of claim 2, wherein the logic gate includes:
a second AND gate configured to perform a first AND operation on a non-inverted output signal of the D-latch and the second complement control signal, and to transfer a result of the first AND operation to a set input terminal of the D-flip-flop; and
a third AND gate configured to perform a second AND operation on an inverted output signal of the D-latch and the second complement control signal, and to transfer a result of the second AND operation to a reset input terminal of the D-flip-flop.

4. The image sensor of claim 3, wherein, as the inverted first count value, an inverted output signal of the first D-flip-flop is fed back to a data input terminal of the first D-flip-flop.

5. The image sensor of claim 2, wherein the D-latch stores the inverted first count value in response to a falling edge of the first complement control signal.

6. The image sensor of claim 1, wherein the counter further includes a second counting unit that is triggered at a falling edge of the first count value to output a second count value being an upper bit of the first count value, the second counting unit including:
a second complement operation controller configured to store an inverted second count value that is an inverted version of the second count value in response to the first complement control signal, and to output the inverted second count value in response to the second complement control signal; and a second D-flip-flop that is set or reset depending on the inverted second count value output from the second complement operation controller, and configured to output the second count value at a falling edge of the first count value.

7. The image sensor of claim 6, wherein the first counting unit further includes a first multiplexer configured to select, in response to a division control signal, one of the inverted first count value and the inverted second count value to be transferred to the first complement operation controller.

8. The image sensor of claim 7, wherein, when the division control signal and the first and second complement control signals are activated, the first counting unit stores and outputs the inverted second count value.

9. A counter circuit that counts a high period or a low period of an input signal using a clock signal, the counter circuit comprising:
 a first AND gate configured to perform an AND operation on the input signal and the clock signal; and
 a ripple counter triggered by an output of the first AND gate to count a length of the input signal, the ripple counter including a plurality of counting units for counting up or counting down the length of the input signal, each of the plurality of counting units including:
 a D-latch configured to store an inverted counting bit in response to a first complement control signal; and
 a D-flip-flop that is set or reset by the inverted counting bit stored in the D-latch in response to a second complement control signal.

10. The counter circuit of claim 9, wherein each of the plurality of counting units further includes:
 a second AND gate configured to transfer a non-inverted output signal of the D-latch to a set input terminal of the D-flip-flop in synchronization with the second complement control signal; and
 a third AND gate configured to transfer an inverted output signal of the D-latch to a reset input terminal of the D-flip-flop in synchronization with the second complement control signal.

11. The counter circuit of claim 10, wherein the ripple counter includes:
 a first counting unit configured to toggle a least significant count value in synchronization with a falling edge of an output of the first AND gate; and
 a second counting unit triggered at a falling edge of an output of the first counting unit.

12. The counter circuit of claim 11, wherein an inverted output terminal of the first counting unit is connected to a data input terminal of the first counting unit.

13. The counter circuit of claim 9, wherein the first complement control signal and the second complement control signal sequentially transition to a high level to generate a complement of current count bits of the ripple counter.

14. A counter circuit that counts a high period or a low period of an input signal using a clock signal, the counter circuit comprising:
 a first AND gate configured to perform an AND operation on the input signal and the clock signal; and
 a ripple counter including a first counting unit and a second counting unit that are triggered by an output of the first AND gate to count a length of the input signal, the first counting unit toggling a first count bit, and the second counting unit toggling a second count bit that is an upper bit of the first count bit,
 wherein, when a division control signal is activated, the first counting unit latches and outputs an inverted second count bit that is an inverted version of the second count bit toggled by the second counting unit.

15. The counter circuit of claim 14, wherein the first counting unit includes:
 a multiplexer configured to select one of an inverted first count bit, which is an inverted version of the first count bit, and the inverted second count bit depending on the division control signal;
 a complement operation controller configured to latch an output of the multiplexer in response to a first complement control signal, and to output the latched output in response to a second complement control signal; and
 a D-flip-flop that is set or reset depending on the latched output stored in the complement operation controller.

16. The counter circuit of claim 15, wherein, when the division control signal is activated, the multiplexer selects the inverted second count bit to be provided to the complement operation controller.

17. The counter circuit of claim 16, wherein the complement operation controller further includes:
 a D-latch configured to store the output of the multiplexer in response to the first complement control signal;
 a second AND gate configured to transfer a non-inverted output signal of the D-latch to a set input terminal of the D-flip-flop in synchronization with the second complement control signal; and
 a third AND gate configured to transfer an inverted output signal of the D-latch to a reset input terminal of the D-flip-flop in synchronization with the second complement control signal.

18. The counter circuit of claim 17, wherein an inverted output signal of the D-flip-flop is fed back as the inverted first count bit of the multiplexer.

19. The counter circuit of claim 17, wherein, when the first complement control signal and the second complement control signal are sequentially activated in a state where the division control signal is activated, a complement operation and a division operation are continuously performed on a count value corresponding to the input signal.

* * * * *